United States Patent

Cheng et al.

(10) Patent No.: US 9,275,911 B2
(45) Date of Patent: Mar. 1, 2016

(54) HYBRID ORIENTATION FIN FIELD EFFECT TRANSISTOR AND PLANAR FIELD EFFECT TRANSISTOR

(71) Applicant: GLOBALFOUNDRIES U.S. INC., Grand Cayman (KY)

(72) Inventors: Kangguo Cheng, Schenectady, NY (US); Balasubramanian S. Haran, Watervliet, NY (US); Shom Ponoth, Clifton Park, NY (US); Theodorus E. Standaert, Clifton Park, NY (US); Tenko Yamashita, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 308 days.

(21) Appl. No.: 13/650,591

(22) Filed: Oct. 12, 2012

(65) Prior Publication Data
US 2014/0103450 A1 Apr. 17, 2014

(51) Int. Cl.
*H01L 27/088* (2006.01)
*H01L 21/762* (2006.01)
*H01L 21/84* (2006.01)
*H01L 27/12* (2006.01)

(52) U.S. Cl.
CPC ........ *H01L 21/845* (2013.01); *H01L 21/76283* (2013.01); *H01L 27/1211* (2013.01)

(58) Field of Classification Search
CPC ............................ H01L 27/088; H01L 21/762
USPC .............. 257/401, E27.06, E21.546; 438/424
See application file for complete search history.

(56) References Cited

U.S. PATENT DOCUMENTS

| | | |
|---|---|---|
| 6,657,259 B2 | 12/2003 | Fried et al. |
| 6,821,826 B1 | 11/2004 | Chan et al. |
| 7,432,149 B2 | 10/2008 | Wu et al. |
| 7,439,109 B2 | 10/2008 | Anderson et al. |
| 7,547,917 B2 | 6/2009 | Gauthier, Jr. et al. |
| 7,608,491 B2 | 10/2009 | Clavelier et al. |
| 7,759,772 B2 | 7/2010 | Ieong et al. |

(Continued)

OTHER PUBLICATIONS

Majumdar, A. et al., "Effects of Substrate Orientation and Channel Stress on Short-Channel Thin SOI MOSFETs" IEEE Transactopms pm Electron Devices (Sep. 2010) pp. 2067-2072, vol. 57, No. 9.

(Continued)

*Primary Examiner* — Jerome Jackson, Jr.
*Assistant Examiner* — Lamont Koo
(74) *Attorney, Agent, or Firm* — Scully, Scott, Murphy & Presser, P.C.

(57) ABSTRACT

A substrate including a handle substrate, a lower insulator layer, a buried semiconductor layer, an upper insulator layer, and a top semiconductor layer is provided. Semiconductor fins can be formed by patterning a portion of the buried semiconductor layer after removal of the upper insulator layer and the top semiconductor layer in a fin region, while a planar device region is protected by an etch mask. A disposable fill material portion is formed in the fin region, and a shallow trench isolation structure can be formed in the planar device region. The disposable fill material portion is removed, and gate stacks for a planar field effect transistor and a fin field effect transistor can be simultaneously formed. Alternately, disposable gate structures and a planarization dielectric layer can be formed, and replacement gate stacks can be subsequently formed.

15 Claims, 20 Drawing Sheets

(56) References Cited

U.S. PATENT DOCUMENTS

| | | |
|---|---|---|
| 7,833,854 B2 | 11/2010 | Ieong et al. |
| 7,863,117 B2 | 1/2011 | Mousa et al. |
| 8,030,177 B2 | 10/2011 | Shimomura et al. |
| 8,053,844 B2 | 11/2011 | Chidambarrao |
| 8,125,007 B2 | 2/2012 | Anderson et al. |
| 2005/0082531 A1* | 4/2005 | Rim .................... 257/72 |
| 2006/0071275 A1* | 4/2006 | Brask et al. .................... 257/350 |
| 2006/0113605 A1* | 6/2006 | Currie .................... 257/368 |
| 2006/0226491 A1 | 10/2006 | Gauthier, Jr. et al. |
| 2008/0050866 A1* | 2/2008 | Booth et al. .................... 438/157 |
| 2008/0283958 A1* | 11/2008 | Ohnuma .................... 257/506 |
| 2009/0014796 A1* | 1/2009 | Liaw .................... 257/347 |
| 2009/0096003 A1* | 4/2009 | Zhu .................... 257/309 |
| 2009/0174001 A1 | 7/2009 | Lee et al. |
| 2009/0294800 A1* | 12/2009 | Cheng et al. .................... 257/192 |
| 2011/0175152 A1 | 7/2011 | Booth, Jr. et al. |
| 2011/0233634 A1 | 9/2011 | Cai et al. |
| 2012/0138953 A1 | 6/2012 | Cai et al. |
| 2012/0168832 A1 | 7/2012 | Anderson et al. |
| 2012/0220083 A1 | 8/2012 | Currie |

OTHER PUBLICATIONS

Wang, M. et al., "Hot-Carrier Degradation in Undoped-Body ETSOI FETs and SOI FINFETs" IEEE International Reliability Physics Symposium (IRPS) (May 2-6, 2010) pp. IRPS10-1099-IRPS10-1104.

International Search Report and Written Opinion dated Dec. 26, 2013, issued in International Application No. PCT/US2013/058671.

* cited by examiner

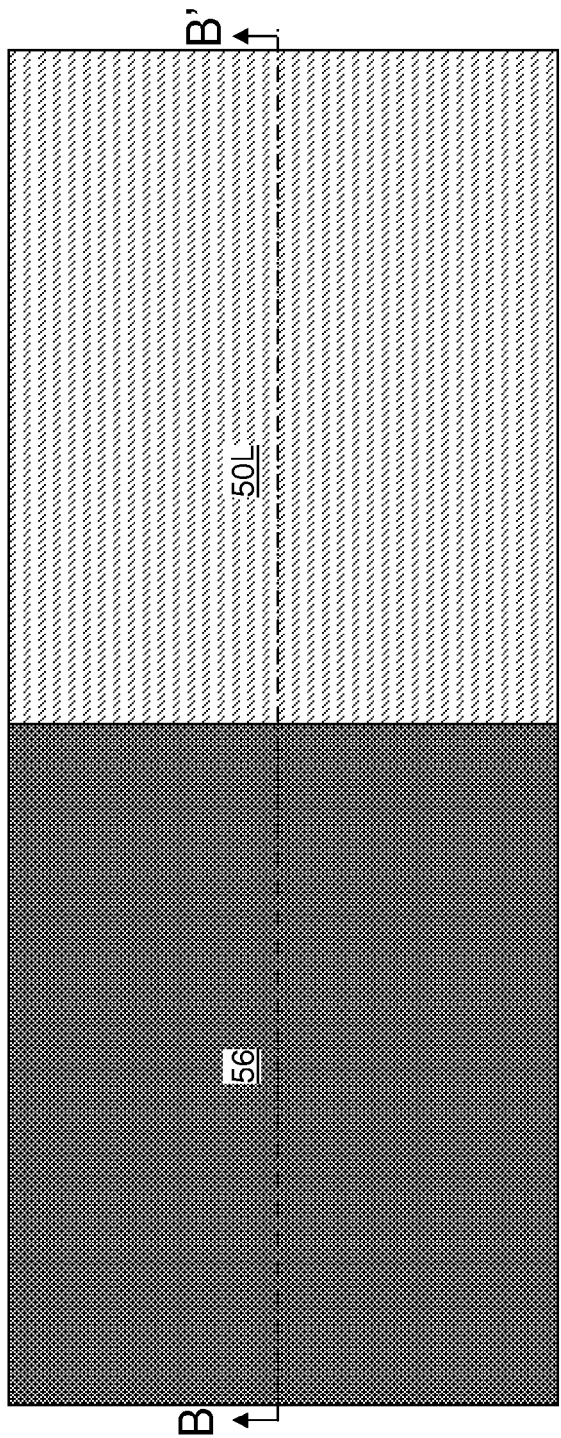
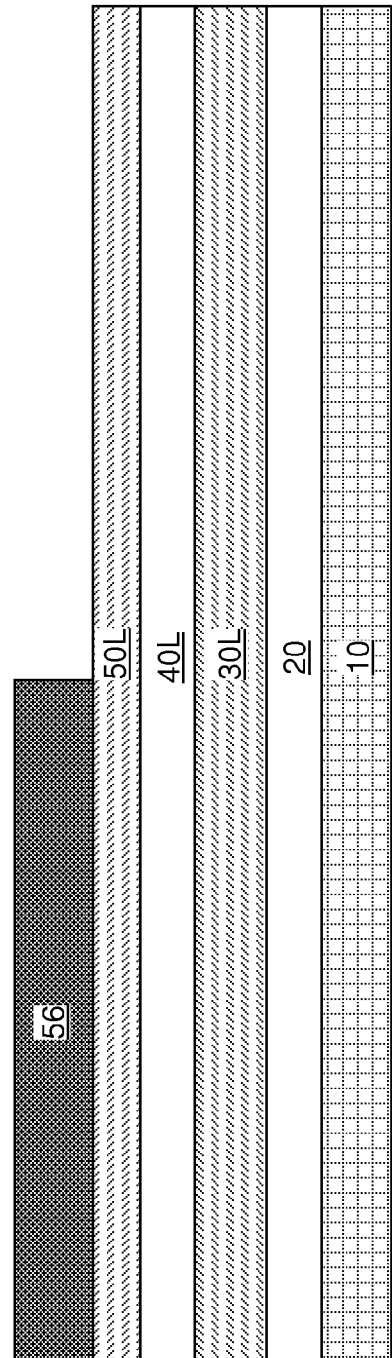

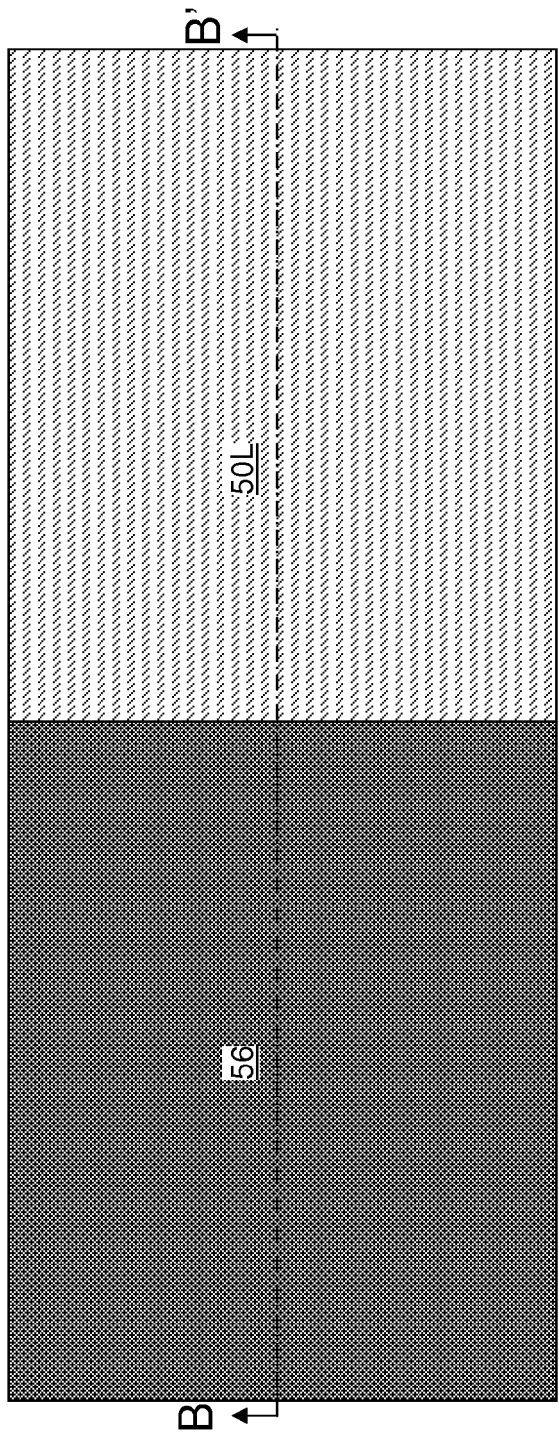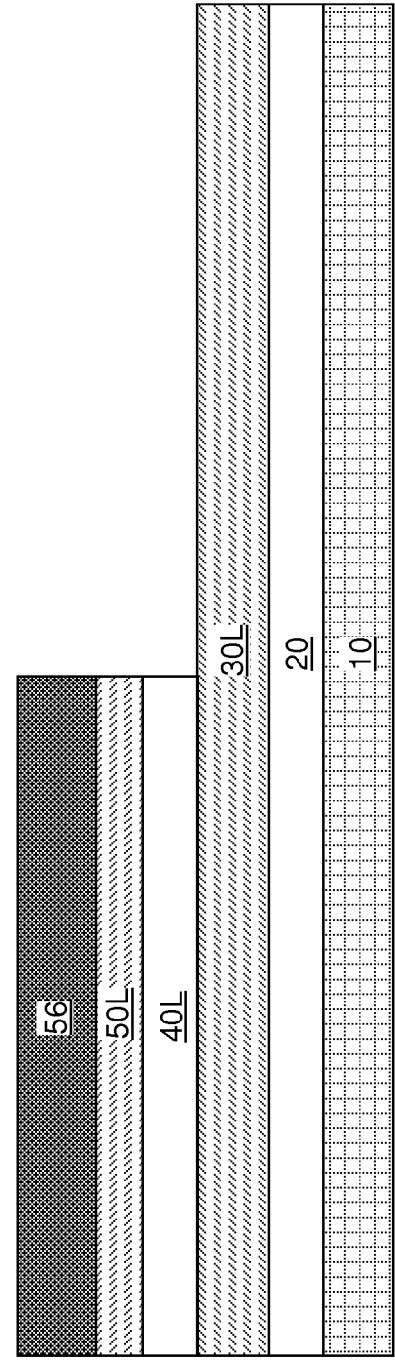

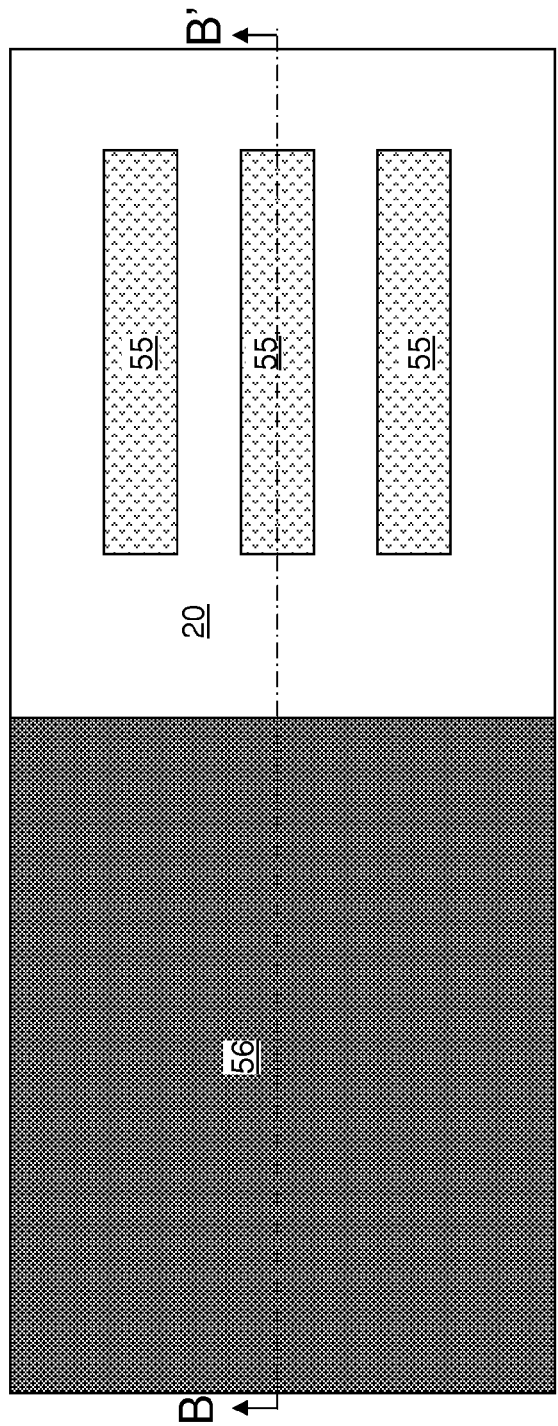
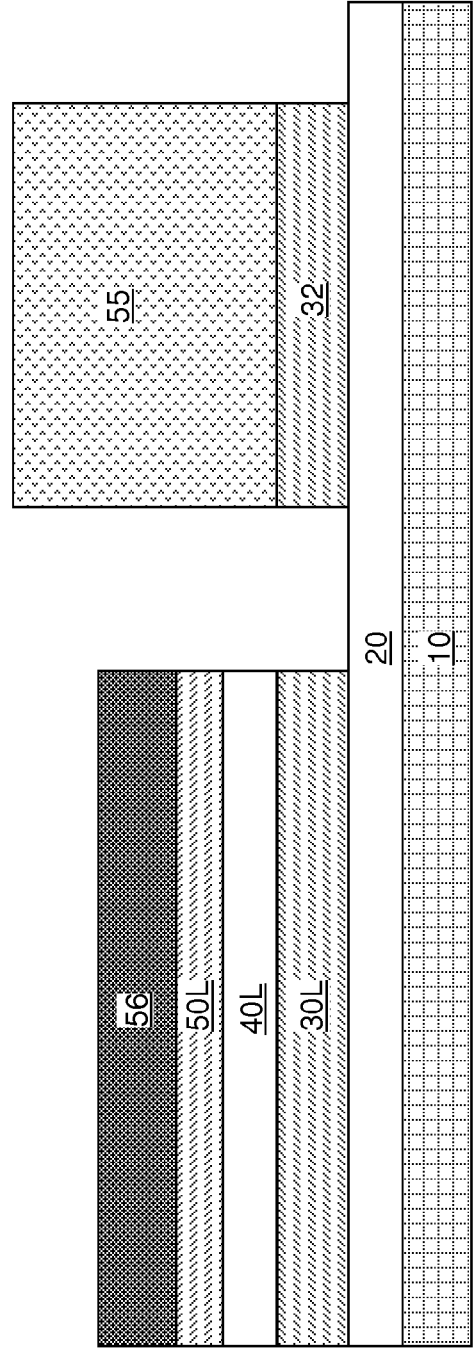

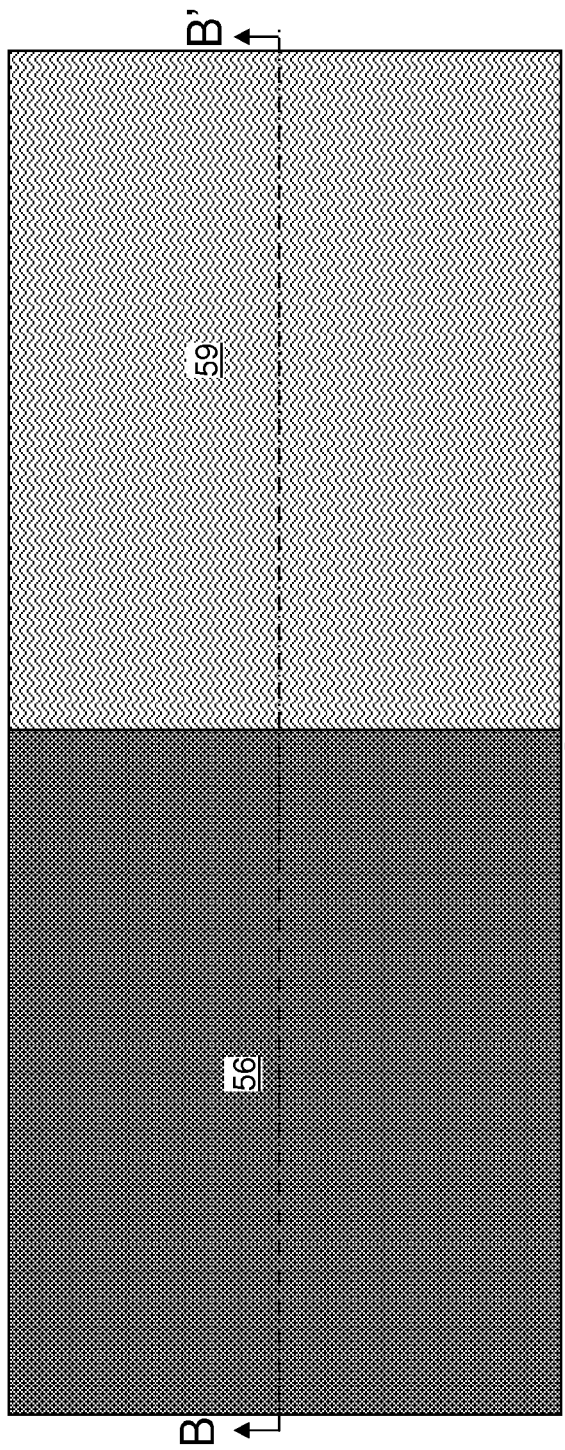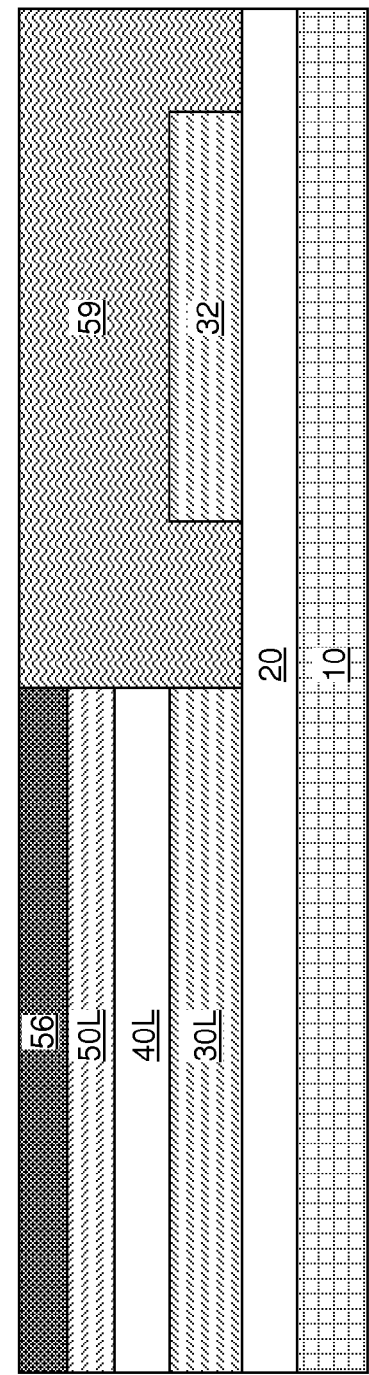

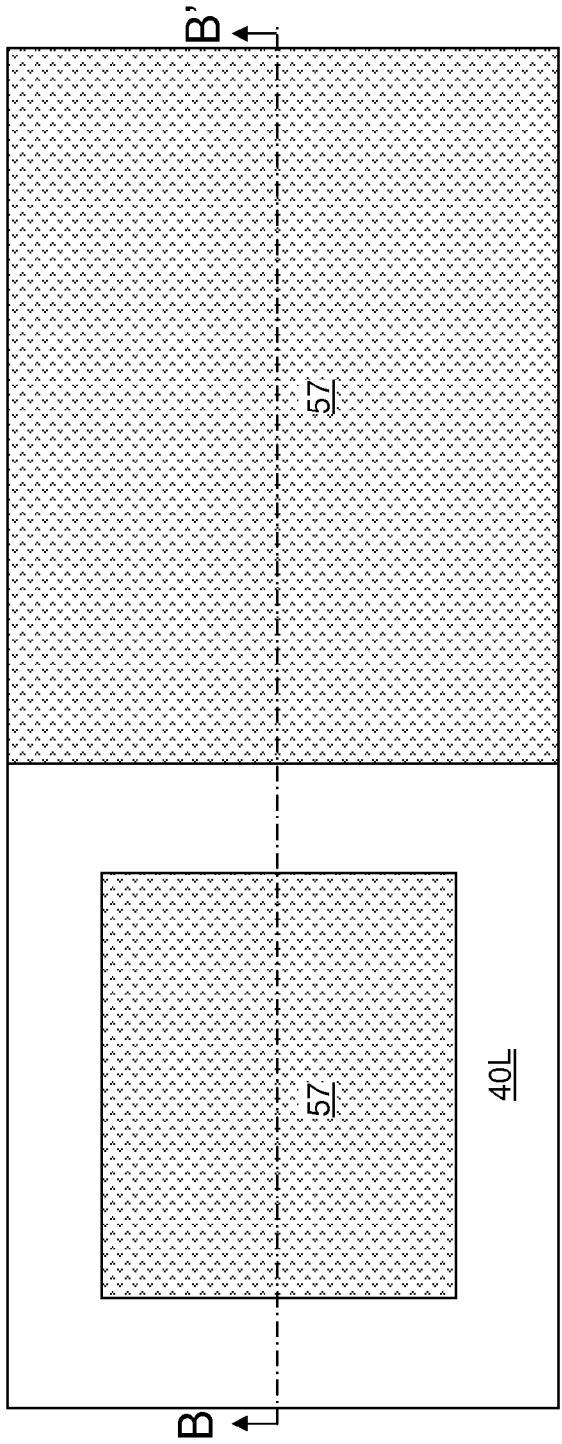
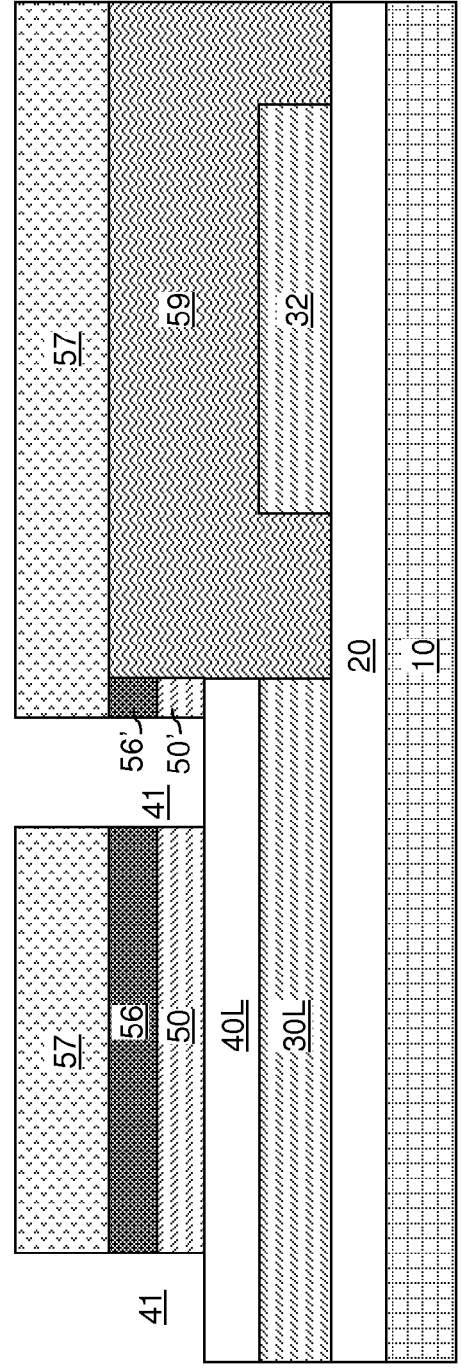
FIG. 6A
FIG. 6B

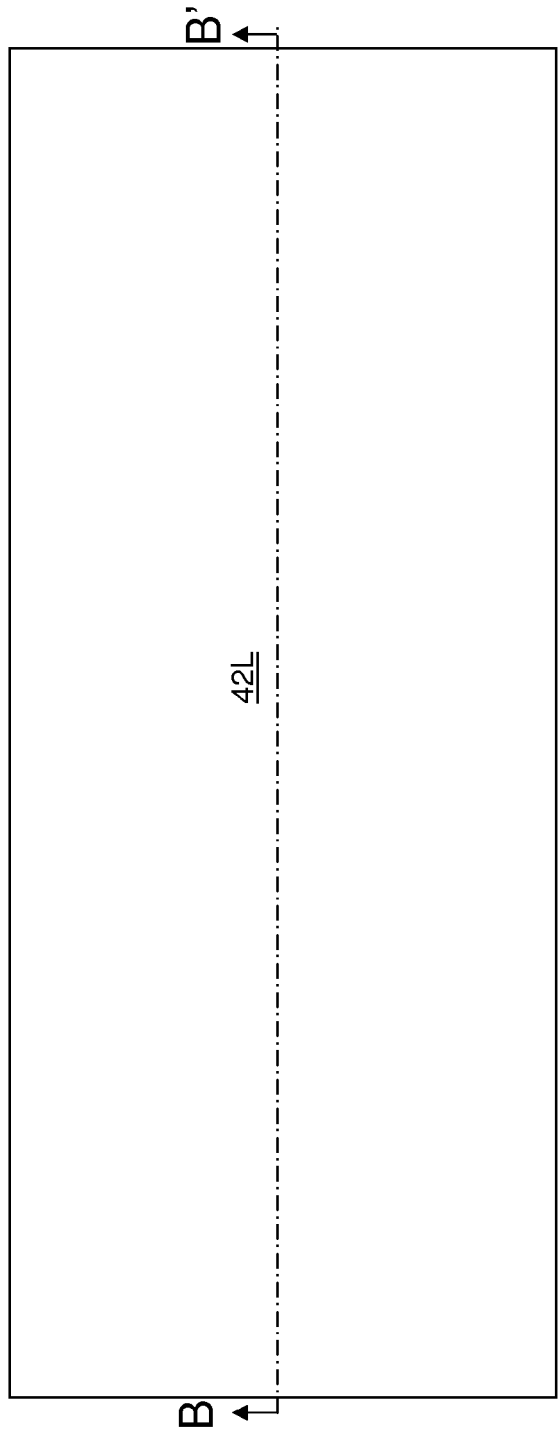
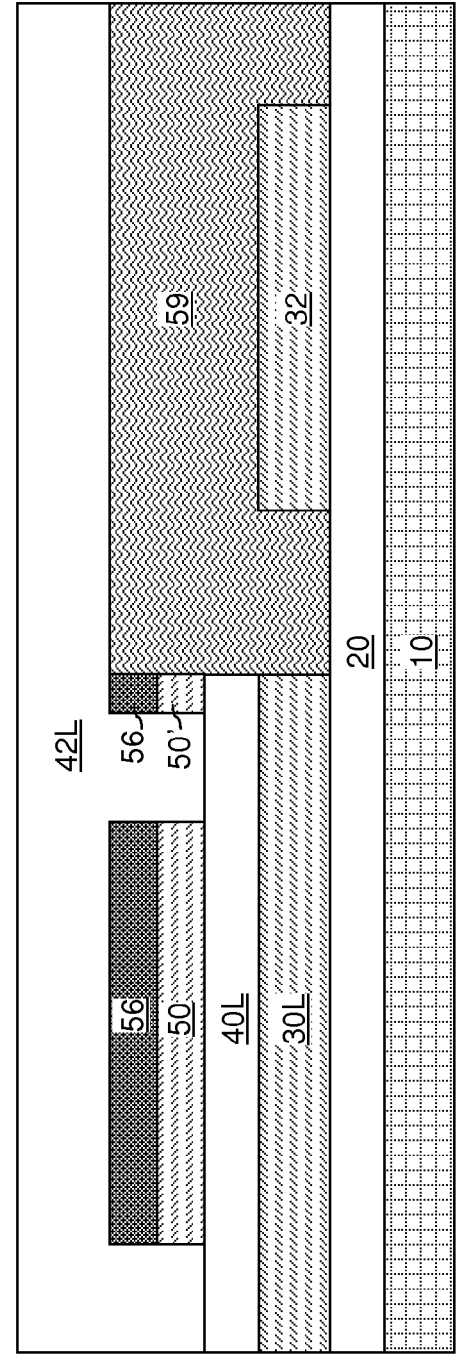

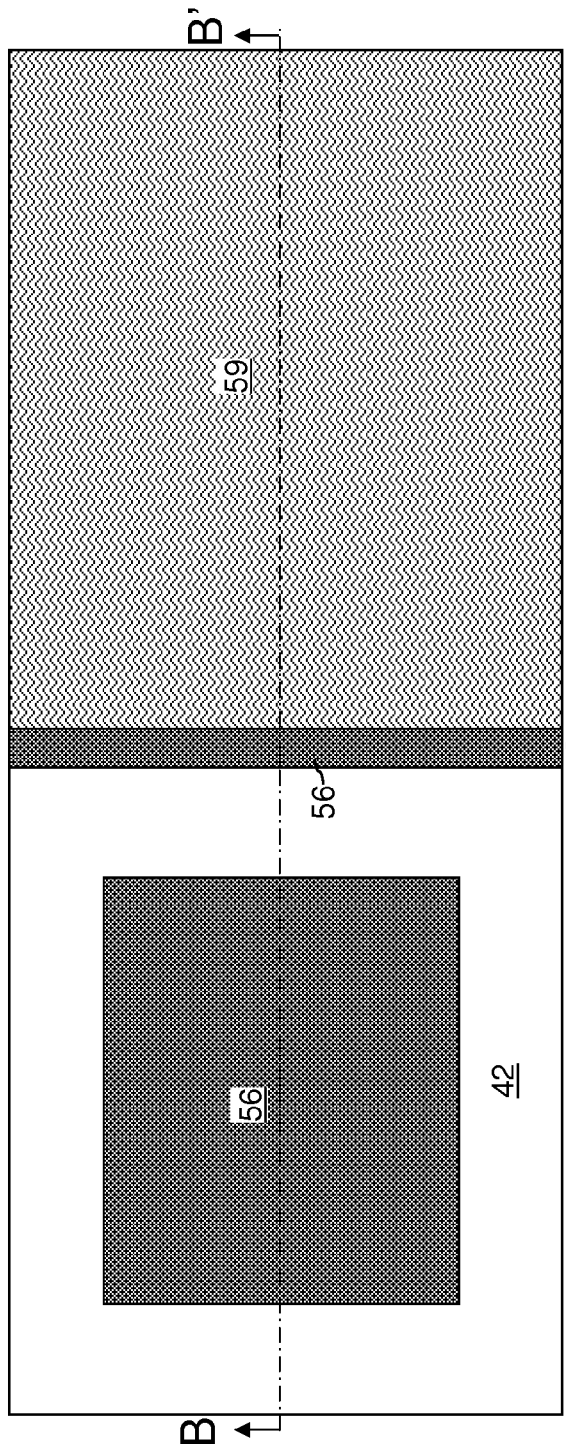
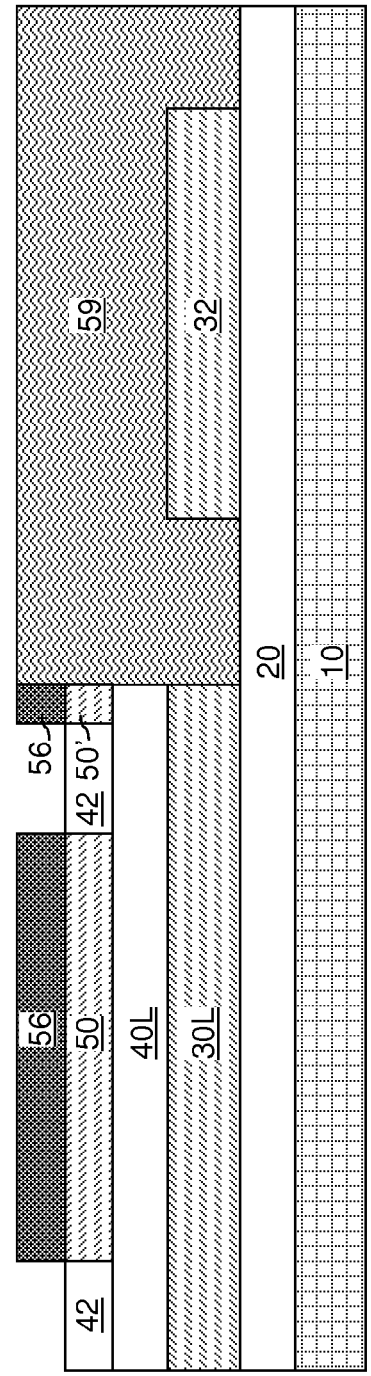
FIG. 8A
FIG. 8B

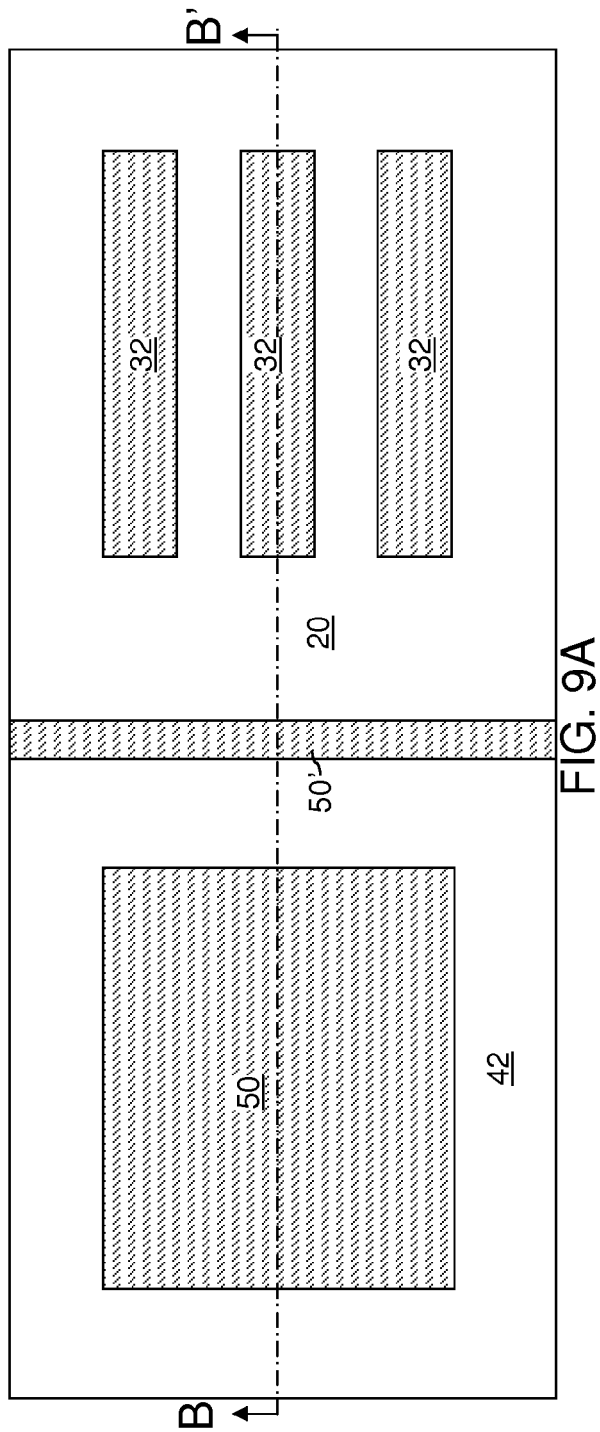
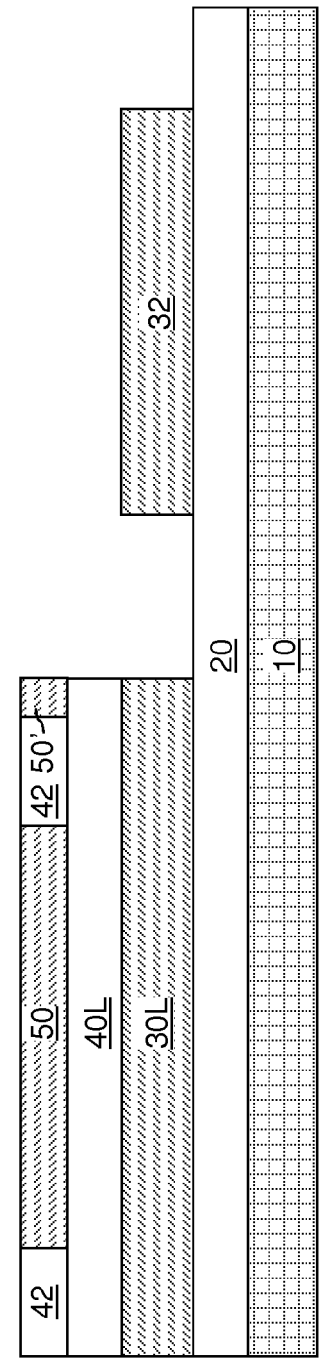
FIG. 9A
FIG. 9B

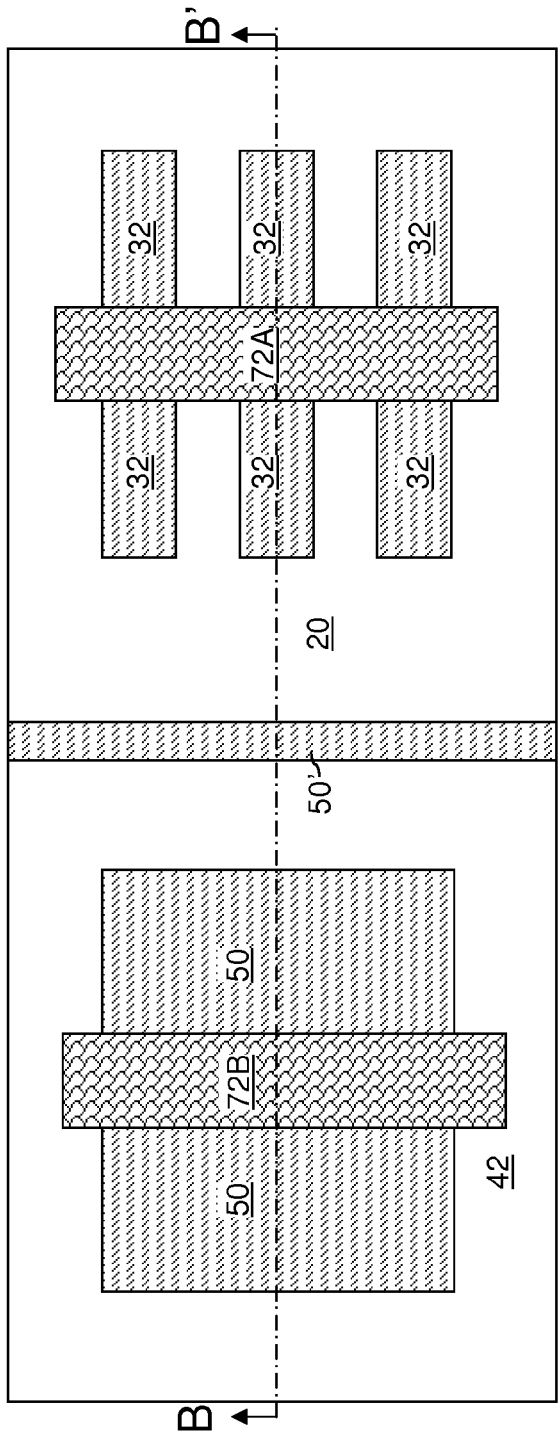
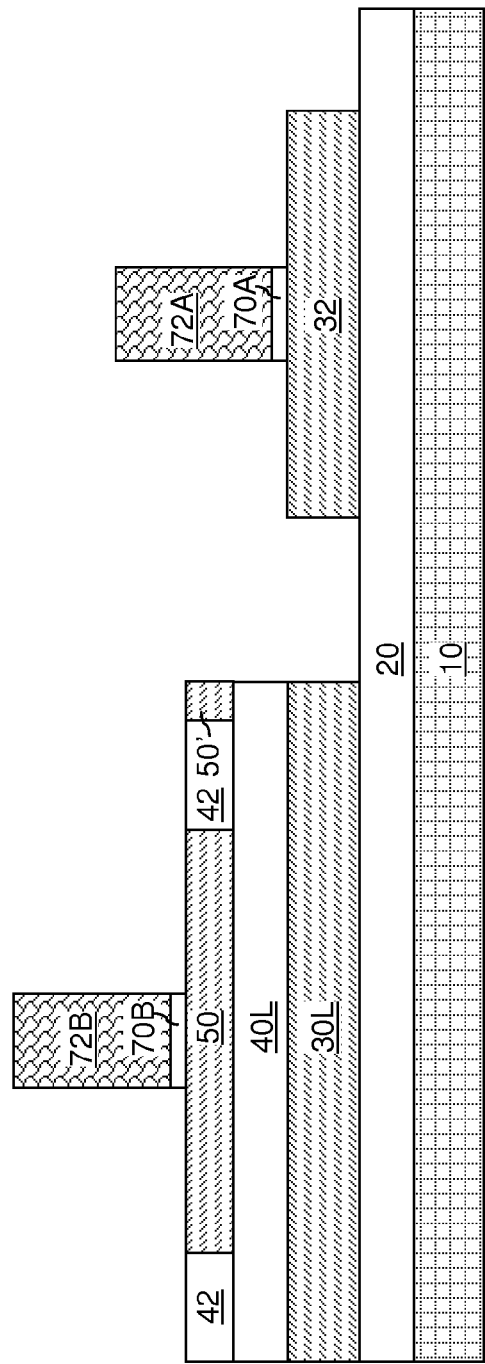
FIG. 10A
FIG. 10B

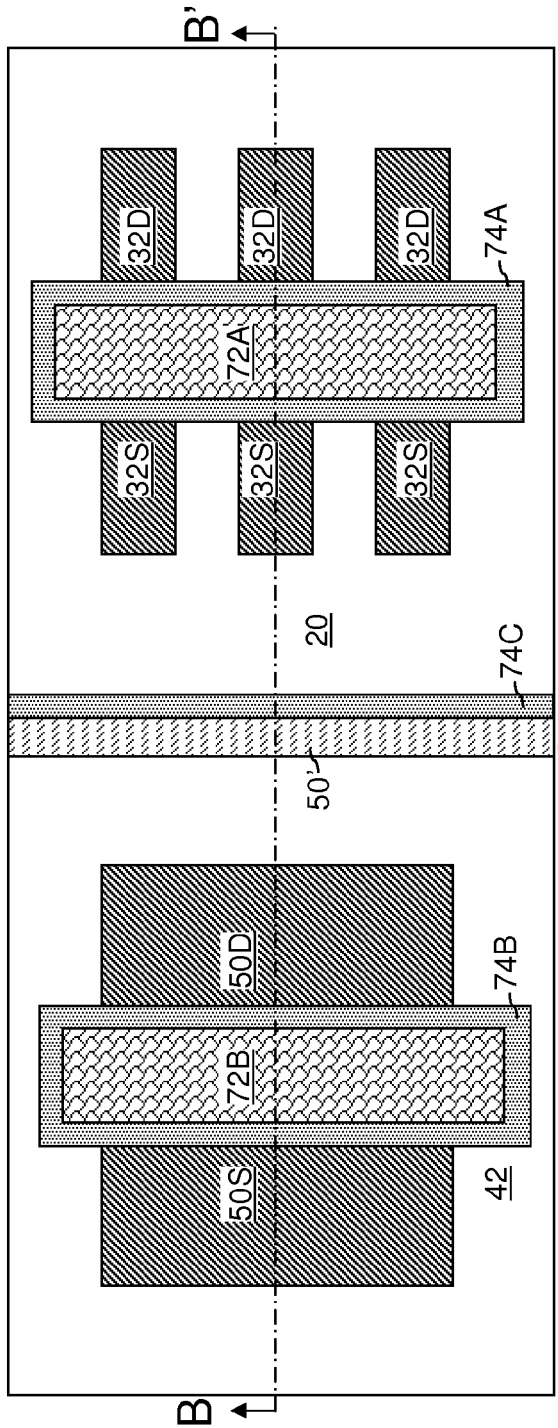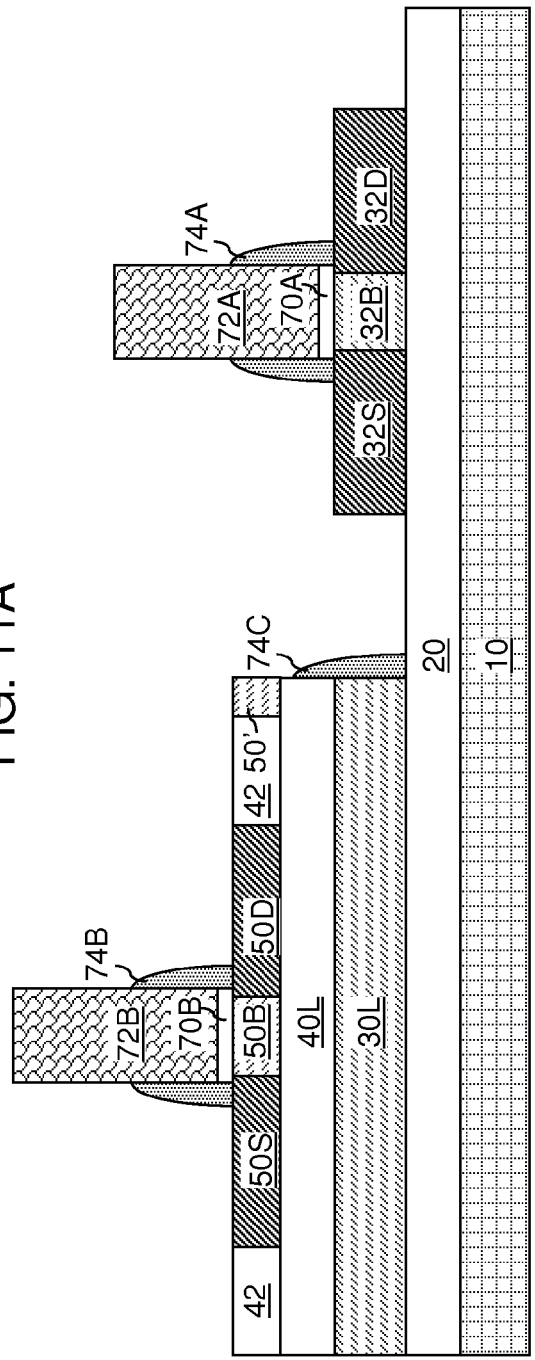

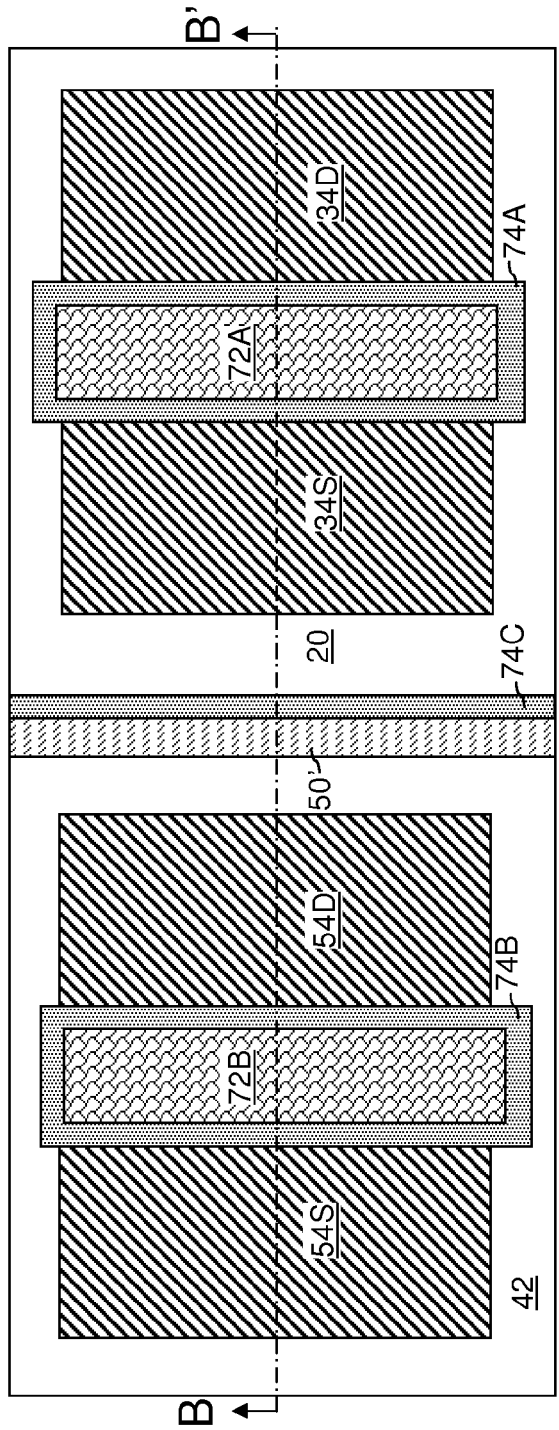
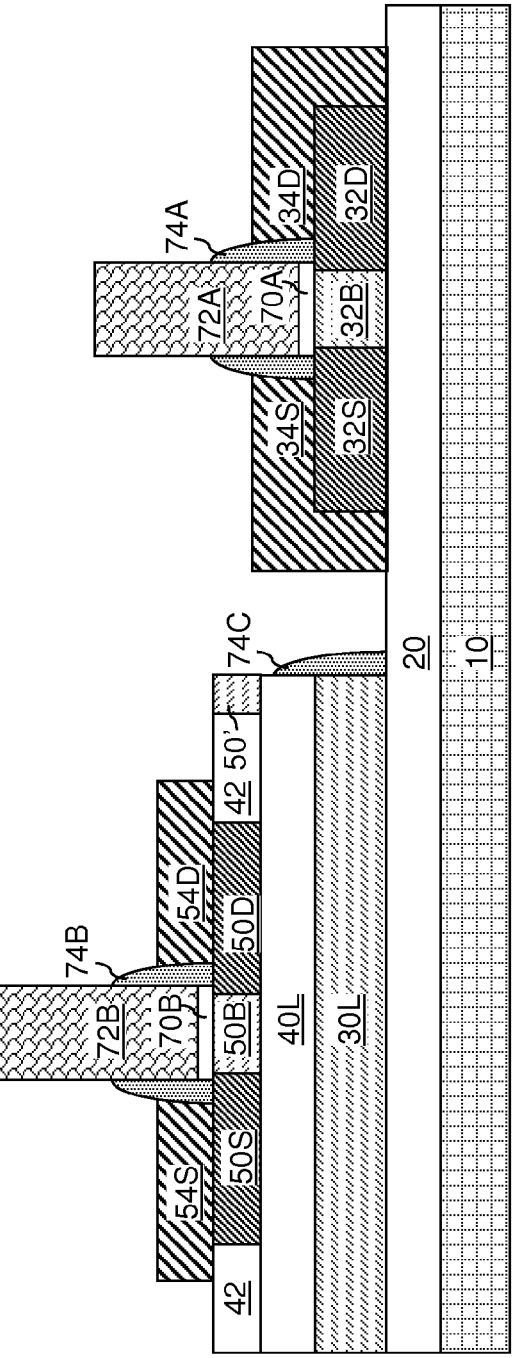
FIG. 12A
FIG. 12B

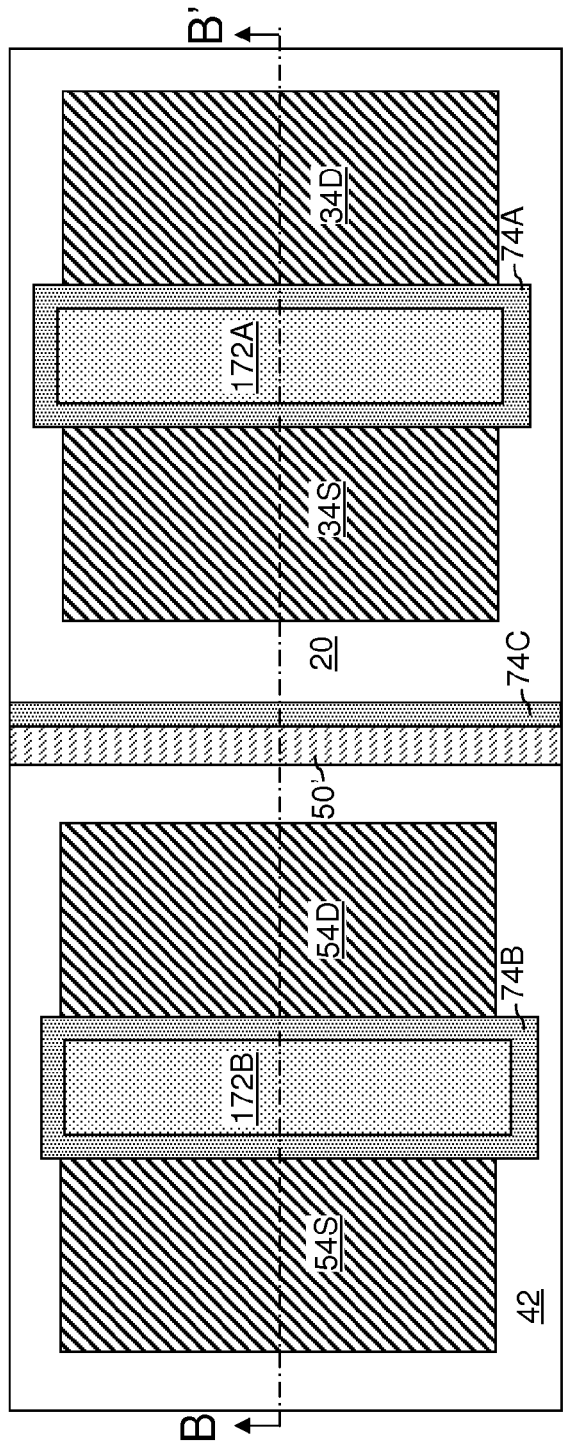
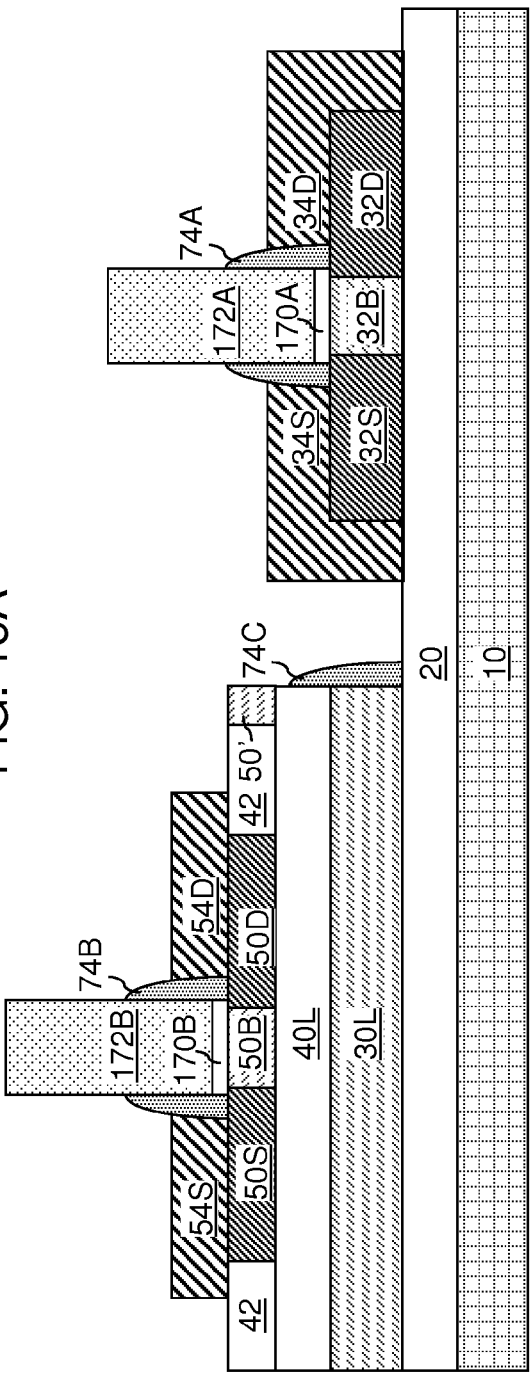
FIG. 15A
FIG. 15B

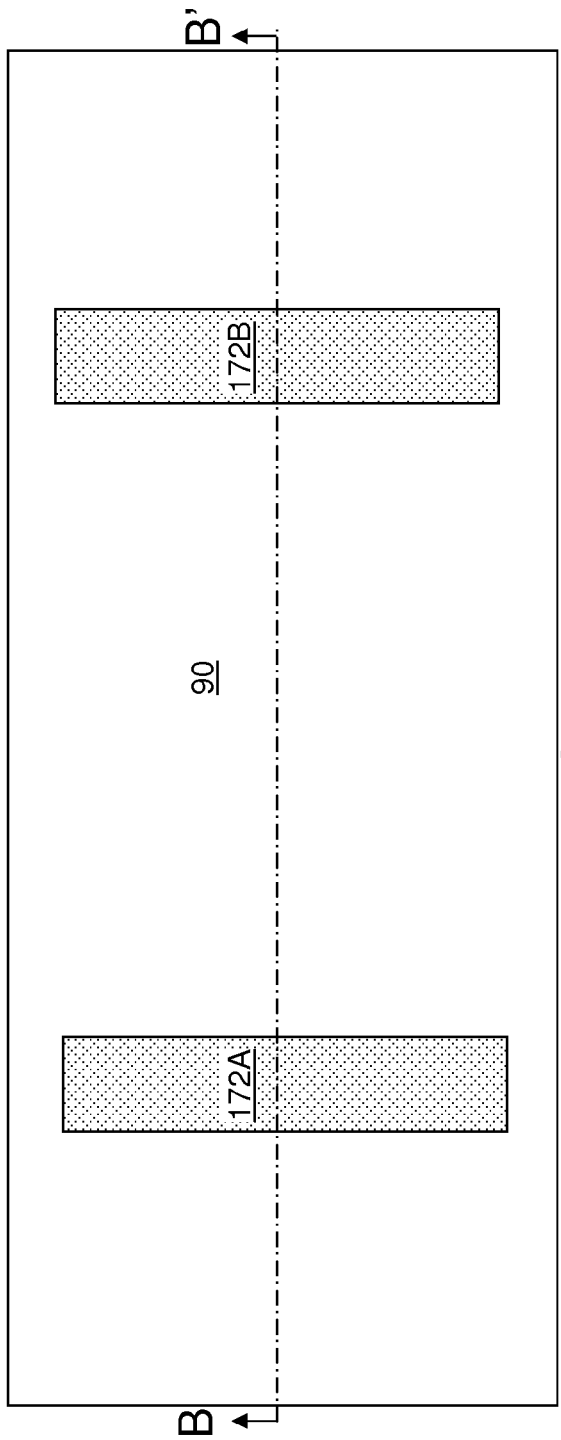
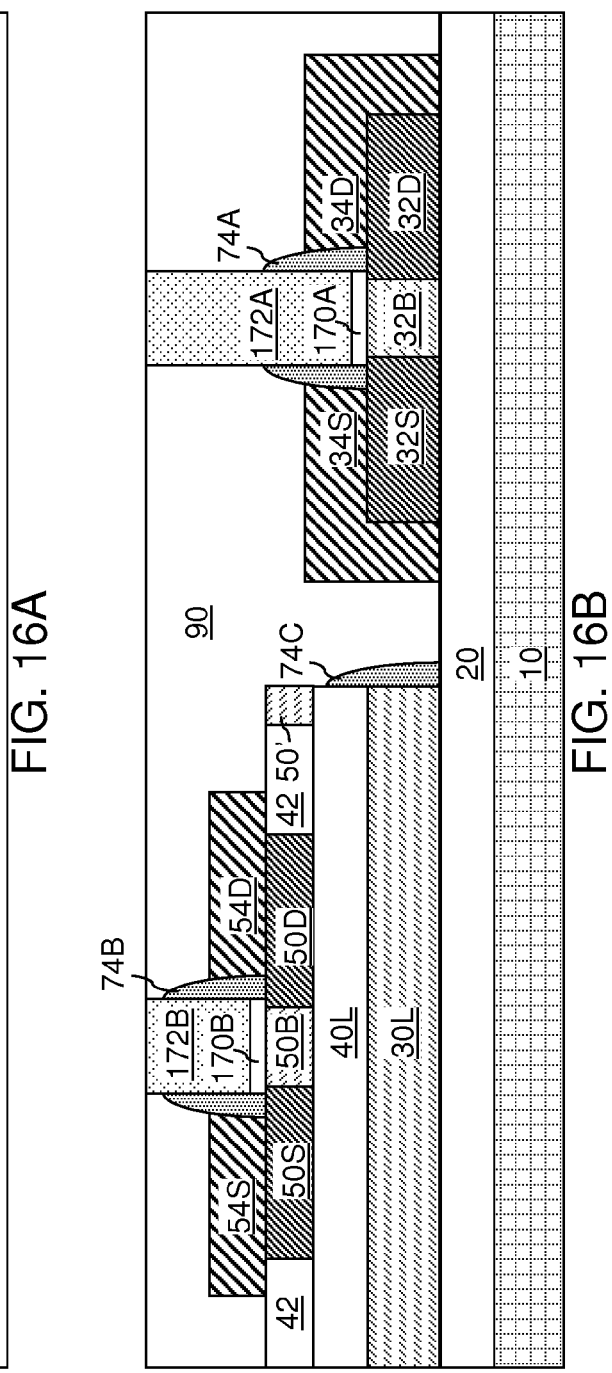
FIG. 16A
FIG. 16B

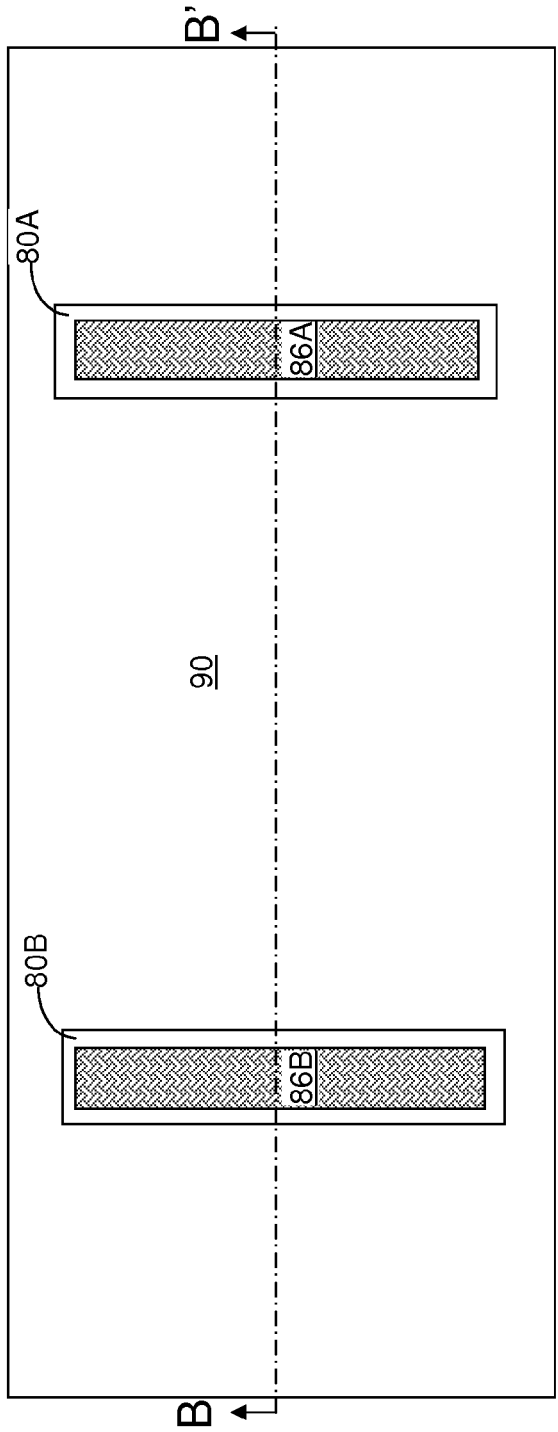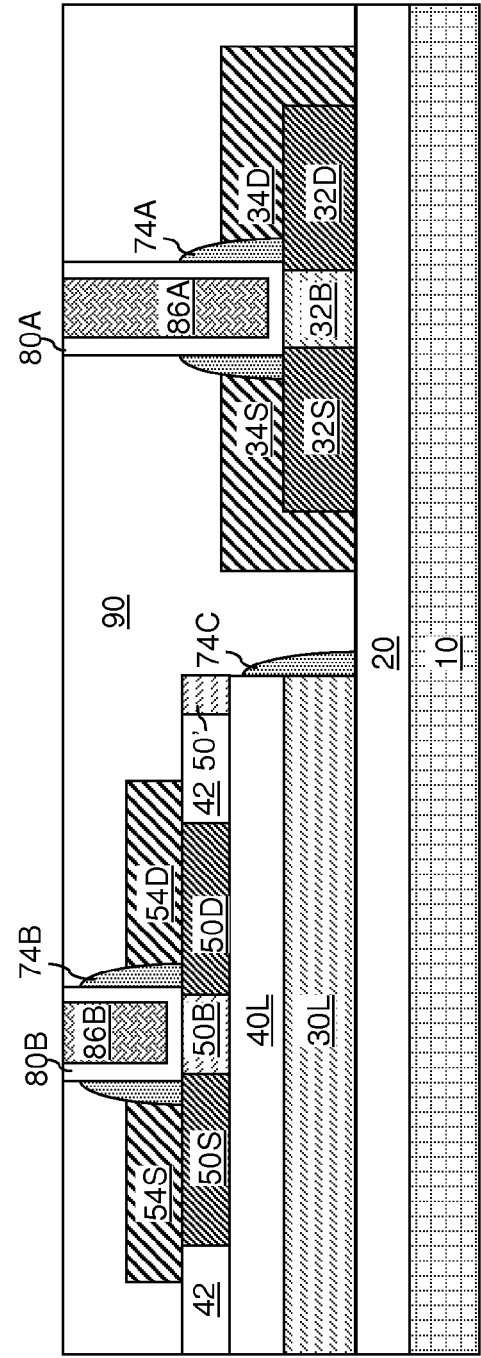

HYBRID ORIENTATION FIN FIELD EFFECT TRANSISTOR AND PLANAR FIELD EFFECT TRANSISTOR

BACKGROUND

The present disclosure relates to a semiconductor structure, and more particularly to a semiconductor structure including a fin field effect transistor and a planar field effect transistor having different crystallographic orientations for channels, and a method of manufacturing the same.

A planar field effect transistor is a field effect transistor including a channel that underlies a horizontal surface of a semiconductor material in contact with a gate dielectric. A fin field effect transistor is a field effect transistor including at least one channel located directly underneath a substantially vertical sidewall of a semiconductor fin.

Conventional integration schemes for forming fin field effect transistors provide n-type fin field effect transistors and p-type fin field effect transistors having the same crystallographic orientations for the surfaces of the channels, i.e., substantially vertical surfaces that contact gate dielectrics. For the purpose of maximizing the on-current of fin field effect transistors, it may be desirable to form an n-type field effect transistor in a semiconductor material layer having a (100) top surface, and to form a p-type field effect transistor in another semiconductor material layer having a (110) top surface. Further, it may also be desirable to employ different semiconductor materials for an n-type field effect transistor and for a p-type field effect transistor in order to provide high on-current for each type of fin field effect transistors.

SUMMARY

A substrate including a handle substrate, a lower insulator layer, a buried semiconductor layer, an upper insulator layer, and a top semiconductor layer is provided. Semiconductor fins can be formed by patterning a portion of the buried semiconductor layer after removal of the upper insulator layer and the top semiconductor layer in a fin region, while a planar device region is protected by an etch mask. A disposable fill material portion is formed in the fin region, and a shallow trench isolation structure can be formed in the planar device region. The disposable fill material portion is removed, and gate stacks for a planar field effect transistor and a fin field effect transistor can be simultaneously formed. Alternately, disposable gate structures and a planarization dielectric layer can be formed, and replacement gate stacks can be formed for a planar field effect transistor and a fin field effect transistor.

According to an aspect of the present disclosure, a semiconductor structure is provided, which includes a fin field effect transistor located on a first portion of a lower insulator layer. The fin field effect transistor includes at least one semiconductor fin and a first gate stack. Each of the at least one semiconductor fin includes a fin source region, a fin drain region, and a fin body region. The first gate stack includes a first gate dielectric and a first gate electrode and straddles each of the at least one semiconductor fin. The semiconductor structure further includes a planar field effect transistor located on a stack, from bottom to top, of a second portion of the lower insulator layer, a buried semiconductor layer, and an upper insulator layer. The planar field effect transistor includes a top semiconductor portion and a second gate stack. The top semiconductor portion includes a planar source region, a planar drain region, and a planar body region. The second gate stack includes a second gate dielectric and a second gate electrode. The semiconductor structure further includes a planarization dielectric layer having a planar top surface. A top surface of the first gate electrode and a top surface of the second gate electrode are coplanar with the planar top surface.

According to another aspect of the present disclosure, another semiconductor structure is provided, which includes a fin field effect transistor located on a first portion a lower insulator layer. The fin field effect transistor includes at least one semiconductor fin and a first gate stack. Each of the at least one semiconductor fin includes a fin source region, a fin drain region, and a fin body region. The first gate stack includes a first gate dielectric and a first gate electrode and straddles each of the at least one semiconductor fin. The semiconductor structure further includes a planar field effect transistor located on a stack, from bottom to top, of a second portion of the lower insulator layer, a buried semiconductor layer, and an upper insulator layer. The planar field effect transistor includes a top semiconductor portion and a second gate stack. The top semiconductor portion includes a planar source region, a planar drain region, and a planar body region. The second gate stack includes a second gate dielectric and a second gate electrode. A first vertical distance from an interface between the first gate electrode and a topmost surface of the first gate dielectric to a topmost surface of the first gate electrode is substantially the same as a second vertical distance from an interface between the second gate electrode and the second gate dielectric to a topmost surface of the second gate electrode.

According to yet another aspect of the present disclosure, a method of forming a semiconductor structure is provided. A region of a substrate including a stack, from bottom to top, of a handle substrate, a lower insulator layer, a buried semiconductor layer, an upper insulator layer, and a top semiconductor layer is masked, while removing portions of the top semiconductor layer and the upper insulator layer in another region of the substrate. At least one semiconductor fin is formed by patterning the buried semiconductor layer within the other region. A disposable fill material portion is formed over the at least semiconductor fin in the other region. A shallow trench isolation structure laterally surrounding a portion of the top semiconductor layer in the region is formed. A first gate stack and a second gate stack are simultaneously formed over the at least one semiconductor fin and over the portion of the top semiconductor layer, respectively.

BRIEF DESCRIPTION OF SEVERAL VIEWS OF THE DRAWINGS

FIG. 1A is a top-down view of a first exemplary semiconductor structure after forming and patterning a masking material layer according to an embodiment of the present disclosure.

FIG. 1B is a vertical cross-sectional view of the first exemplary semiconductor structure along the vertical plane B-B' of FIG. 1A.

FIG. 2A is a top-down view of the first exemplary semiconductor structure after etching physically exposed portions of a top semiconductor layer and an upper insulator layer employing the patterned masking material layer as an etch mask according to an embodiment of the present disclosure.

FIG. 2B is a vertical cross-sectional view of the first exemplary semiconductor structure along the vertical plane B-B' of FIG. 2A.

FIG. 3A is a top-down view of the first exemplary semiconductor structure after formation of a plurality of semiconductor fins according to an embodiment of the present disclosure.

FIG. 3B is a vertical cross-sectional view of the first exemplary semiconductor structure along the vertical plane B-B' of FIG. 3A.

FIG. 5A is a top-down view of the first exemplary semiconductor structure after deposition and planarization of a disposable fill material according to an embodiment of the present disclosure.

FIG. 5B is a vertical cross-sectional view of the first exemplary semiconductor structure along the vertical plane B-B' of FIG. 5A.

FIG. 6A is a top-down view of the first exemplary semiconductor structure after formation of shallow trenches according to an embodiment of the present disclosure.

FIG. 6B is a vertical cross-sectional view of the first exemplary semiconductor structure along the vertical plane B-B' of FIG. 6A.

FIG. 7A is a top-down view of the first exemplary semiconductor structure after deposition of a dielectric material according to an embodiment of the present disclosure.

FIG. 7B is a vertical cross-sectional view of the first exemplary semiconductor structure along the vertical plane B-B' of FIG. 7A.

FIG. 8A is a top-down view of the first exemplary semiconductor structure after formation of a shallow trench isolation structure by recessing portions of the dielectric material according to an embodiment of the present disclosure.

FIG. 8B is a vertical cross-sectional view of the first exemplary semiconductor structure along the vertical plane B-B' of FIG. 8A.

FIG. 9A is a top-down view of the first exemplary semiconductor structure after removal of the masking material layer and a disposable fill material portion according to an embodiment of the present disclosure.

FIG. 9B is a vertical cross-sectional view of the first exemplary semiconductor structure along the vertical plane B-B' of FIG. 9A.

FIG. 10A is a top-down view of the first exemplary semiconductor structure after formation of gate stacks according to an embodiment of the present disclosure.

FIG. 10B is a vertical cross-sectional view of the first exemplary semiconductor structure along the vertical plane B-B' of FIG. 10A.

FIG. 11A is a top-down view of the first exemplary semiconductor structure after formation of gate spacers, a dielectric spacer, and various source and drain regions according to an embodiment of the present disclosure.

FIG. 11B is a vertical cross-sectional view of the first exemplary semiconductor structure along the vertical plane B-B' of FIG. 11A.

FIG. 12A is a top-down view of the first exemplary semiconductor structure after formation of various raised source and drain regions according to an embodiment of the present disclosure.

FIG. 12B is a vertical cross-sectional view of the first exemplary semiconductor structure along the vertical plane B-B' of FIG. 12A.

FIG. 15A is a top-down view of a second exemplary semiconductor structure after formation of disposable gate structures, gate spacers, a dielectric spacer, various source and drain regions, and various raised source and drain regions according to an embodiment of the present disclosure.

FIG. 15B is a vertical cross-sectional view of the first exemplary semiconductor structure along the vertical plane B-B' of FIG. 15A.

FIG. 16A is a top-down view of a second exemplary semiconductor structure after formation of a planarization dielectric layer according to an embodiment of the present disclosure.

FIG. 16B is a vertical cross-sectional view of the first exemplary semiconductor structure along the vertical plane B-B' of FIG. 16A.

FIG. 17A is a top-down view of a second exemplary semiconductor structure after formation of replacement gate structures according to an embodiment of the present disclosure.

FIG. 17B is a vertical cross-sectional view of the first exemplary semiconductor structure along the vertical plane B-B' of FIG. 17A.

DETAILED DESCRIPTION

Figure 4A:
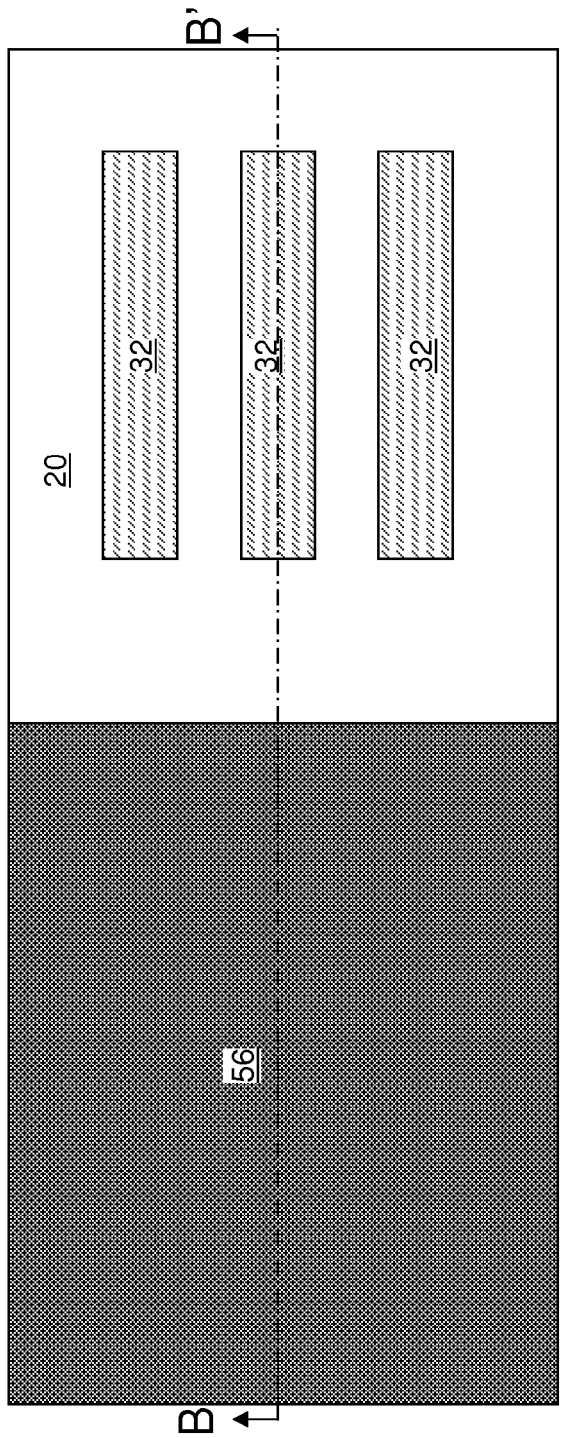
FIG. 4A is a top-down view of the first exemplary semiconductor structure after removal of a photoresist layer according to an embodiment of the present disclosure.

As stated above, the present disclosure relates to a semiconductor structure including a fin field effect transistor and a planar field effect transistor having different crystallographic orientations for channels, and a method of manufacturing the same. Aspects of the present disclosure are now described in detail with accompanying figures. It is noted that like reference numerals refer to like elements across different embodiments. The drawings are not necessarily drawn to scale.

Referring to FIGS. 1A and 1B, a first exemplary semiconductor structure according to an embodiment of the present disclosure illustrates a substrate (10, 20, 30L, 40L, 50L), which includes a stack, from bottom to top, of a handle substrate 10, a lower insulator layer 20, a buried semiconductor layer 50L, an upper insulator layer 40L, and a top semiconductor layer 50L. The vertical stack can be provided as a dual semiconductor-on-insulator (SOI) substrate. Alternately, multiple substrates can be bonded to form the stack of the first exemplary semiconductor structure.

The handle substrate 10 can include a semiconductor material, a conductive material, and/or a dielectric material. The handle substrate 10 provides mechanical support to the buried insulator layer 20 and the top semiconductor layer 50L. The thickness of the handle substrate 10 can be from 30 microns to 2 mm, although lesser and greater thicknesses can also be employed.

Each of the lower buried insulator layer 20 and the upper buried insulator layer 40L includes a dielectric material such as silicon oxide, silicon nitride, silicon oxynitride, or a combination thereof. The thickness of the lower buried insulator layer 20 can be from 50 nm to 5 microns, although lesser and greater thicknesses can also be employed. The thickness of the upper buried insulator layer 20 can also be from 50 nm to 5 microns, although lesser and greater thicknesses can also be employed.

Each of the buried semiconductor layer 30L and the top semiconductor layer 50L is a semiconductor material layer. Each semiconductor material of the buried semiconductor layer 30L and the top semiconductor layer 50L can be an elemental semiconductor material or a compound semiconductor material. For example, each of the semiconductor materials material of the buried semiconductor layer 30L and the top semiconductor layer 50L can be silicon, germanium, a silicon-germanium alloy, or a silicon-carbon alloy. The semiconductor materials may, or may not, be doped with p-type dopants and/or n-type dopants.

Each of the semiconductor material can be a single crystalline semiconductor material, a polycrystalline semiconductor material, or an amorphous semiconductor material. In one embodiment, each of the buried semiconductor layer 30L and the top semiconductor layer 50L can be a single crystalline semiconductor material layer having a single crystalline semiconductor structure through the entirety thereof. In one embodiment, both of buried semiconductor layer 30L and the top semiconductor layer 50L can be a single crystalline semiconductor material layer having a single crystalline semiconductor structure through the entirety thereof. In one embodiment, the top semiconductor layer SOL includes the same semiconductor material as the bottom semiconductor layer 30L. In another embodiment, the top semiconductor layer 50L includes a different semiconductor material than the buried semiconductor layer 30L.

In one embodiment, the semiconductor materials of the buried semiconductor layer 30L and the top semiconductor layer 50L can be silicon. In another embodiment, the semiconductor material of one of the buried semiconductor layer 30L and the top semiconductor layer SOL can be silicon, and the semiconductor material of the other of the buried semiconductor layer 30L and the top semiconductor layer 50L can be a silicon-germanium alloy or a silicon-carbon alloy. In one embodiment, the semiconductor materials of the buried semiconductor layer 30L and the top semiconductor layer 50L can be single crystalline silicon. In another embodiment, the semiconductor material of one of the buried semiconductor layer 30L and the top semiconductor layer 50L can be silicon, and the semiconductor material of the other of the buried semiconductor layer 30L and the top semiconductor layer 50L can be a single crystalline silicon-germanium alloy or a single crystalline silicon-carbon alloy. The thickness of the buried semiconductor layer 30L can be from 10 nm to 500 nm, although lesser and greater thicknesses can also be employed. The thickness of the top semiconductor layer 50L can be from 10 nm to 500 nm, although lesser and greater thicknesses can also be employed.

In one embodiment, the semiconductor materials of the buried semiconductor layer 30L and the top semiconductor layer 50L is single crystalline, and have a same crystal structure and a same set of three independent crystallographic orientations. For example, the same set three independent crystallographic orientations can be a set of three independent crystallographic axes. If the same crystal structure is cubic, for example, the set of three independent crystallographic axes can include the [100] direction, the [010] direction, and the [001] direction.

In one embodiment, the bottom semiconductor layer 30L includes a single crystalline semiconductor material having a first set of spatial directions for a set of three independent crystallographic orientations, and the top semiconductor layer 50L includes another single crystalline semiconductor material having a second set of spatial directions for the same set of three independent crystallographic orientations. In one embodiment, the first set of spatial directions for a single crystalline structure of the buried semiconductor layer 30L can be rotated relative to the second set of spatial directions of a single crystalline structure of the top semiconductor layer 50L.

A region of the substrate (10, 20, 30L, 40L, 50L) is masked with a masking material layer 56. In one embodiment, the masking material layer 56 can be a dielectric material layer including silicon oxide, silicon nitride, silicon oxynitride, a dielectric metal oxide, or a dielectric metal oxynitride. In one embodiment, the masking material layer 56 can be deposited as a blanket layer having a same thickness throughout over the entirety of the top semiconductor layer 50L, and can be subsequently patterned. The remaining portion of the masking material layer 56 covers a first device region of the substrate (10, 20, 30L, 40L, 50L), while a complementary region of the first device region of the substrate (10, 20, 30L, 40L, 50L) is not covered by the remaining portion of the masking material layer 56. The complementary region is herein referred to as a second device region.

Referring to FIGS. 2A and 2B, physically exposed portions of the top semiconductor layer 50L and the upper buried insulator layer 40L are etched employing the making material layer 56 as an etch mask. The etch employed to remove the physically exposed portions of the top semiconductor layer 50L and the upper buried insulator layer 40L can be an anisotropic etch (such as a reactive ion etch) or an isotropic etch (such as a wet etch). Different etch chemistries can be employed to etch the physically exposed portion of the top semiconductor layer 50L in the second device region and to etch the physically exposed portion of the upper buried insulator layer 40L in the second device region. In one embodiment, the top surface of the buried insulator layer 30L may be employed as an etch stop layer for the etch of the upper buried insulator layer 40L.

Referring to FIGS. 3A and 3B, a photoresist layer 55 is applied at least over the physically exposed portion of the buried semiconductor layer 30L and is lithographically patterned to cover the buried semiconductor layer 30L with shapes of semiconductor fins to be subsequently formed. For example, the shapes of the semiconductor fins to be subsequently formed in the second device region may include a plurality of rectangular shapes each having a pair of lengthwise directions. As used herein, the lengthwise direction of a rectangular shape refers to the direction of the two sides of the rectangular shape having a greater length that the other two sides of the rectangular shape. In one embodiment, the plurality of rectangular shapes may include a one-dimensional array of rectangular shapes having a periodicity along a horizontal direction that is perpendicular to the lengthwise direction of the rectangular shapes. Alternately, the shapes of the semiconductor fins may include any polygonal shape, any curvilinear two-dimensional shape, or any combination of one or more segments of at least one polygonal shape and one or more segments of at least one curvilinear two-dimensional shape provided that the shape generally extends along one horizontal direction (a lengthwise direction) more than another horizontal direction.

The pattern in the photoresist layer 55 is transferred into the portion of the buried insulator layer 30L located within the second device region to form at least one semiconductor fin 32. In one embodiment, each of the at least one semiconductor fin 32 can have a vertical dimension between a bottommost surface and a topmost surface, i.e., a height, that is substantially the same as a thickness of the buried semiconductor layer 30L. As used herein, a first dimension is substantially the same as a second dimension if the difference between the first dimension and the second dimension does not exceed inherent variability in surface topography generated by a planarization process to form the surfaces that define the end points of the first dimension and the surfaces that define the end points of the second dimension. In one embodiment, inherent variability of vertical dimensions of planar surfaces can be less than 5 nm. In some embodiment, the inherent variability of vertical dimensions of planar surfaces can be less than 1 nm. In one embodiment, the entirety of the buried semiconductor layer 30L may be single crystalline prior to the transfer of the pattern in the photoresist layer 55 into the portion of the buried semiconductor layer 30L in the second device region. In this case, the buried semiconductor layer 30L and each of the at least one semiconductor fin 32 can include the same single crystalline semiconductor material, have the same crystal structure, and the same set of spatial directions for each of three independent crystallographic orientations.

In one embodiment, the top semiconductor layer 50L can include the same semiconductor material as, or a different semiconductor material than, the semiconductor material of the buried semiconductor layer 30L. The single crystalline semiconductor material of the top semiconductor layer SOL may, or may not, have a same crystal structure as the at least one semiconductor fin 32. If the single crystalline semiconductor material of the top semiconductor layer 50L has the same crystal structure as the at least one semiconductor fin 32, a first set of spatial directions for three independent crystallographic orientations of the single crystalline structure of the at least one semiconductor fin 32 and the buried semiconductor layer 30L can be rotated relative to a second set of spatial directions for three independent crystallographic orientations of the single crystalline structure of the top semiconductor layer 50L.

Figure 4B:
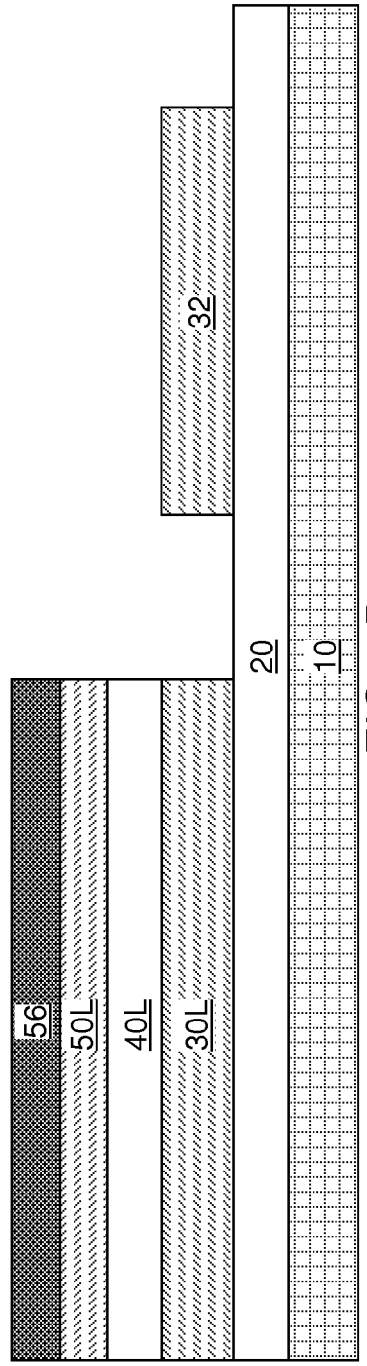
FIG. 4B is a vertical cross-sectional view of the first exemplary semiconductor structure along the vertical plane B-B' of FIG. 4A.

Referring to FIGS. 4A and 4B, the photoresist layer 55 is removed selective to the at least one semiconductor fin 32, for example, by ashing.

Referring to FIGS. 5A and 5B, a disposable fill material is deposited over the at least one semiconductor fin 32 and the masking material layer 56, and is planarized to form a disposable fill material portion 59. The disposable fill material can be a semiconductor material different from the semiconductor material of the at least one semiconductor fin 32, or can be a dielectric material that is different from the dielectric materials of the lower buried insulator layer 20 and the upper buried insulator layer 40L.

For example, if the semiconductor material(s) of the at least one semiconductor fin include(s) silicon and/or a silicon-germanium alloy having an atomic germanium concentration less than 20% and/or a silicon-carbon alloy, the disposable fill material can be germanium or a silicon-germanium alloy having an atomic concentration of germanium greater than 40%. If the dielectric material(s) of the lower buried insulator layer 20 and the upper buried insulator layer 40L do(es) not include silicon nitride, the disposable fill material can be silicon nitride. Alternately, the disposable fill material can be organosilicate glass (OSG).

The disposable fill material can be deposited over the at least one semiconductor fin 32 and the masking material layer 56, for example, by chemical vapor deposition (CVD), atomic layer deposition (ALD), spin-coating, or combinations thereof. The disposable fill material can be self-planarizing, or can be planarized, for example, by chemical mechanical planarization and/or a recess etch employing the masking material layer 56 as a stopping layer. Thus, the disposable fill material can be planarized by removing the disposable fill material from above the horizontal plane of the top surface of the remaining portion of the masking material layer 56.

Referring to FIGS. 6A and 6B, a photoresist layer 57 is applied over the masking material layer 56 and the disposable fill material portion 59, and is lithographically patterned to form at least one opening therein. The pattern in the at least one opening in the photoresist layer 57 is transferred into the top semiconductor layer 50L by an etch, which can be an anisotropic etch, to form at least one shallow trench 41 within the top semiconductor layer 50L. Each of the at least one shallow trench extends from a top surface of the masking material layer 56 at least to the top surface of the upper insulator layer 40L. The remaining portions of the top semiconductor layer 50L can include a top semiconductor portion 50 laterally surrounded by the at least one shallow trench 41, and another top semiconductor portion 50' laterally contacting the disposable fill material portion 59. The photoresist layer 57 can be subsequently removed, for example, by ashing.

Referring to FIGS. 7A and 7B, a shallow trench isolation dielectric layer 42L including a dielectric material is deposited within the at least one shallow trench 41 and over the top surfaces of the masking material layer 56 and the disposable fill material portion 59. The dielectric material of the shallow trench isolation dielectric layer 42L can include, for example, silicon oxide, silicon nitride, silicon oxynitride, or combinations thereof. The shallow trench isolation dielectric layer 42L can be deposited, for example, by chemical vapor deposition (CVD), atomic layer deposition (ALD), or by spin coating. The shallow trench isolation dielectric layer 42L can be deposited with sufficient conformality to fill each of the at least one shallow trench 41 without a seam therein.

Referring to FIGS. 8A and 8B, the portion of the shallow trench isolation layer 42L above the top surface of the masking material layer 56 and the disposable fill material portion 59 is removed, for example, by a recess etch or chemical mechanical planarization. The masking material layer 56, and optionally, the disposable fill material portion 59 can be employed as a stopping layer. Subsequently, the remaining portion of the shallow trench isolation layer 42L is recessed below the top surface of the masking material layer 56 to form at least one shallow trench isolation structure 42. In one embodiment, the at least one shallow trench isolation structure 42 laterally surrounds the top semiconductor portion 50. The top surface(s) of the at least one shallow trench isolation structure 42 can be coplanar with, located above, or located below the top surface of the top semiconductor portion 50.

The removal of the material of the shallow trench isolation layer 42L below the plane of the top surface of the masking material layer 56 (which can be coplanar with the top surface of the disposable fill material portion 59) can be selective or non-selective to the material of the disposable fill material portion 59. If the removal of the material of the shallow trench isolation layer 42L below the plane of the top surface of the masking material layer 56 is performed employing an etch process that is not selective to the material of the disposable fill material portion 59, the etch rate of the material of the disposable fill material portion 59 may be less than, greater than, or equal to, the etch rate of the material of the shallow trench isolation layer 42L provided that the etch process does not remove the semiconductor material of the at least one semiconductor fin 32.

Further, the removal of the material of the shallow trench isolation layer 42L below the plane of the top surface of the masking material layer 56 (which can be coplanar with the top surface of the disposable fill material portion 59) can be selective or non-selective to the material of the masking material layer 56. If the removal of the material of the shallow trench isolation layer 42L below the plane of the top surface of the masking material layer 56 is performed employing an etch process that is not selective to the material of the masking material layer 56, the etch rate of the material of the disposable fill material portion 59 may be less than, greater than, or equal to, the etch rate of the material of the masking material layer 56 provided that the etch process does not remove the semiconductor material of the top semiconductor portion 50.

Referring to FIGS. 9A and 9B, the remaining portions of the disposable fill material portion 59 and the remaining portions of the masking material layer 56 are removed selective to the semiconductor material of the at least one semiconductor fin 32 and selective to the semiconductor material of the top semiconductor portion 50. If the disposable fill material portion 59 includes germanium or a silicon-germanium alloy, a wet etch including hydrogen peroxide and water can be employed to remove the disposable fill material portion 59. If the disposable fill material portion 59 includes silicon nitride, a wet etch employing hot phosphoric acid can be employed to remove the disposable fill material portion 59. If the disposable fill material portion 59 includes organosilicate glass, a hydrofluoric acid-based wet etch can be employed to remove the disposable fill material portion 59.

Referring to FIGS. 10A and 10B, gate stacks are formed over the at least one semiconductor fin 32 and the top semiconductor portion 50. For example, a first gate stack including a first gate dielectric 70A and a first gate electrode 72A and straddling the at least one semiconductor fin 32 can be formed in the second device region, and a second gate stack including a second gate dielectric 70B and a second gate electrode 72B and straddling the top semiconductor portion 50 can be formed in the first device region.

The first gate stack (70A, 72A) and the second gate stack (70B, 72B) can be formed, for example, by depositing a stack of a gate dielectric layer and a gate electrode layer, and subsequently patterning the stack of the gate dielectric layer and the gate electrode layer, for example, by applying and patterning a photoresist layer over the stack, and subsequently transferring the pattern in the photoresist layer through the stack of the gate dielectric layer and the gate electrode layer with at least one anisotropic etch.

The first gate stack (70A, 72A) over the at least one semiconductor fin 32 and the second gate stack (70B, 72B) over the top semiconductor portion 50 are formed simultaneously. The first and second gate dielectrics (70A, 70B) have a same composition and a same thickness, and the first and second gate electrodes (72A, 72B) include a same conductive material and have the same height.

Referring to FIGS. 11A and 11B, source regions and drain regions of field effect transistors can be formed simultaneously or sequentially. A fin source region 32S and a fin drain region 32D can be formed in each of the at least one semiconductor fin 32, for example, by implanting p-type dopants or n-type dopants into portions of the at least one semiconductor fin 32 that are not masked by the first gate stack (70A, 72A). A planar source region 50S and a planar drain region 50D can be formed in the top semiconductor portion 50 by implanting p-type dopants or n-type dopants into sub-portions of the top semiconductor portion 50 that are not masked by the second gate stack (70B, 72B). Each portion of the at least one semiconductor fin 32 that is not implanted with the p-type dopants or n-type dopants constitute a body region of a fin field effect transistor, which is herein referred to as a fin body region 32B. The portion of the top semiconductor portion 50 that is not implanted with the p-type dopants or n-type dopants constitute of another field effect transistor, which is herein referred to as a planar body region 50B.

Optionally, various gate spacers can be formed on the first exemplary semiconductor structure prior to, or after, formation of any of the at least one fin source region 32S, the at least one fin drain region 32D, the planar source region 50S, or the planar drain region 50D. In this case, a first gate spacer 74A surrounding the first gate stack (70A, 72A) can be formed in the first device region, and a second gate spacer 74B surrounding the second gate stack (70B, 72B) can be formed in the second device region. At least one collateral structure can be formed concurrently with the formation of the first gate spacer 74A and the second gate spacer 74B. For example, a dielectric spacer 74C contacting substantially vertical sidewalls of the buried semiconductor layer 30L and the upper insulator layer 40L and contacting a top surface of the lower insulator layer 20 can be formed simultaneously with the formation of the first gate spacer 74A and the second gate spacer 74B. The first gate spacer 74A, the second gate spacer 74B, and the dielectric spacer 74C can include the same dielectric material and can have the same lateral width at each bottom portion thereof.

A fin field effect transistor is formed in the first device region, and a planar field effect transistor is formed in the second device region. As used herein, a fin field effect transistor refers to a field effect transistor including at least one vertical interface between a gate dielectric and a channel of the field effect transistor, and a planar field effect transistor refers to a field effect transistor that does not include any vertical interface between a gate dielectric and a channel of the field effect transistor.

In one embodiment, the fin field effect transistor and the planar field effect transistor can be transistors of the same conductivity type, i.e., either p-type field effect transistors or n-type field effect transistors. In this case, the at least one fin source region 32S and the at least one fin drain region 32D can be formed simultaneously with the formation of the planar source region 50S and the planar drain region 50D.

In another embodiment, the fin field effect transistor and the planar field effect transistor can be transistors of the opposite conductivity type. In this case, the fin field effect transistor can be a p-type field effect transistor and the planar field effect transistor can be an n-type field effect transistor, or vice versa. In this case, formation of the at least one fin source region 32S and the at least one fin drain region 32D and the formation of the planar source region 50S and the planar drain region 50D are performed at different processing steps (which can be, for example, ion implantation steps) while one of the two device regions are protected from introduction of electrical dopants (for example, by an ion implantation mask).

Referring to FIGS. 12A and 12B, various raised source and drain regions are formed, for example, by selective epitaxy. The various raised source and drain regions can include, for example, a raised fin source region 34S epitaxially aligned to each fin source region 32S in the at least one semiconductor fin (32S, 32D, 32B), a raised fin drain region 34D epitaxially aligned to each fin drain region 32D in the at least one semiconductor fin (32S, 32D, 32B), a raised source region 54S in contact with the planar source region 50S, and a raised drain region 54D in contact with the planar drain region 50D. In one embodiment, the first and second gate electrodes (72A, 72B) do not include a physically exposed semiconductor surface, no semiconductor material is deposited on the surfaces of the first and second gate electrodes (72A, 72B).

In one embodiment, the semiconductor material of the raised fin source region 34S, the raised fin drain region 34D, the raised source region 54S, and the raised drain region 54D can be deposited simultaneously in the same selective epitaxy process. If the fin field effect transistor and the planar field effect transistor are transistors of the same conductivity type (p-type or n-type), the raised fin source region 34S, the raised fin drain region 34D, the raised source region 54S, and the raised drain region 54D may be formed with in-situ doping, or may be formed as intrinsic semiconductor material portions and may be subsequently doped by implantation of dopants of the same conductivity type. If the fin field effect transistor and the planar field effect transistor are transistors of the opposite conductivity types, the raised fin source region 34S, the raised fin drain region 34D, the raised source region 54S, and the raised drain region 54D may be formed as intrinsic semiconductor material portions and subsequently doped during different implantations steps by masked ion implantation of dopants of the opposite conductivity type.

In another embodiment, the semiconductor material of the raised fin source region 34S and the raised fin drain region 34D and the semiconductor material of the raised source region 54S and the raised drain region 54D can be deposited employing two separate selective epitaxy processes. In this case, electrical dopants can be introduced into each of the raised fin source region 34S, the raised fin drain region 34D, the raised source region 54S, and the raised drain region 54D by in-situ doping or by an ion implantation after a selective epitaxy process.

Figure 13A:
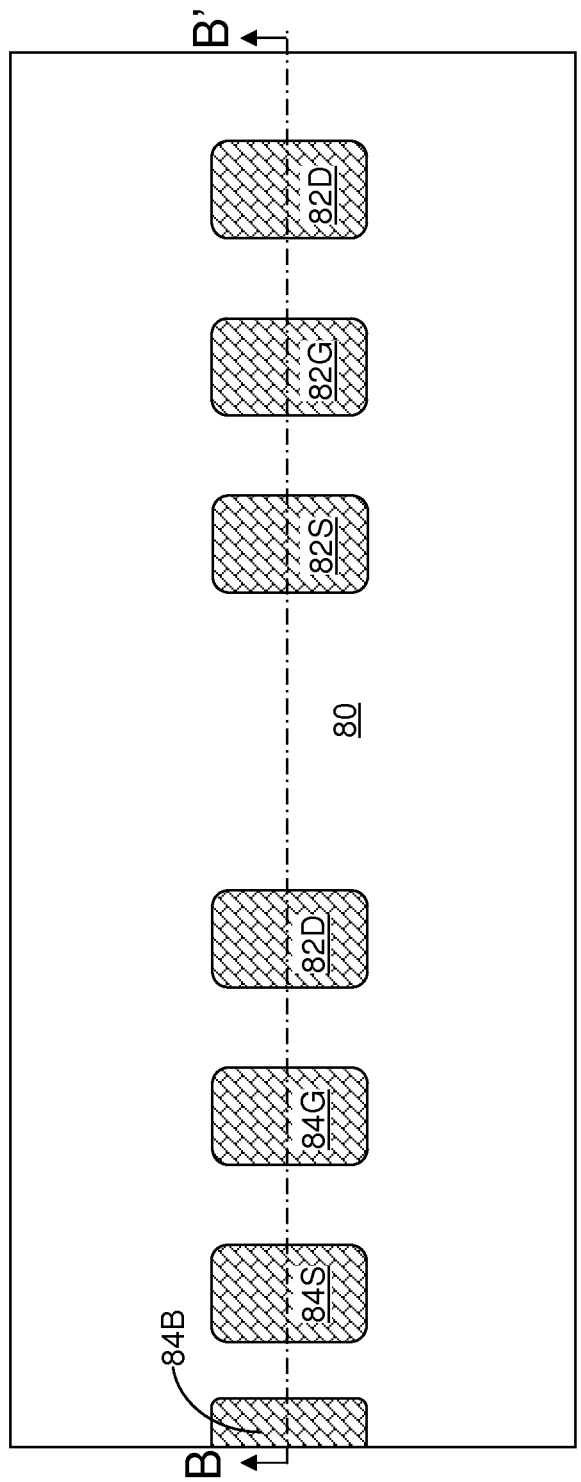
FIG. 13A is a top-down view of the first exemplary semiconductor structure after formation of a contact level dielectric layer and contact via structures according to an embodiment of the present disclosure.
Figure 13B:
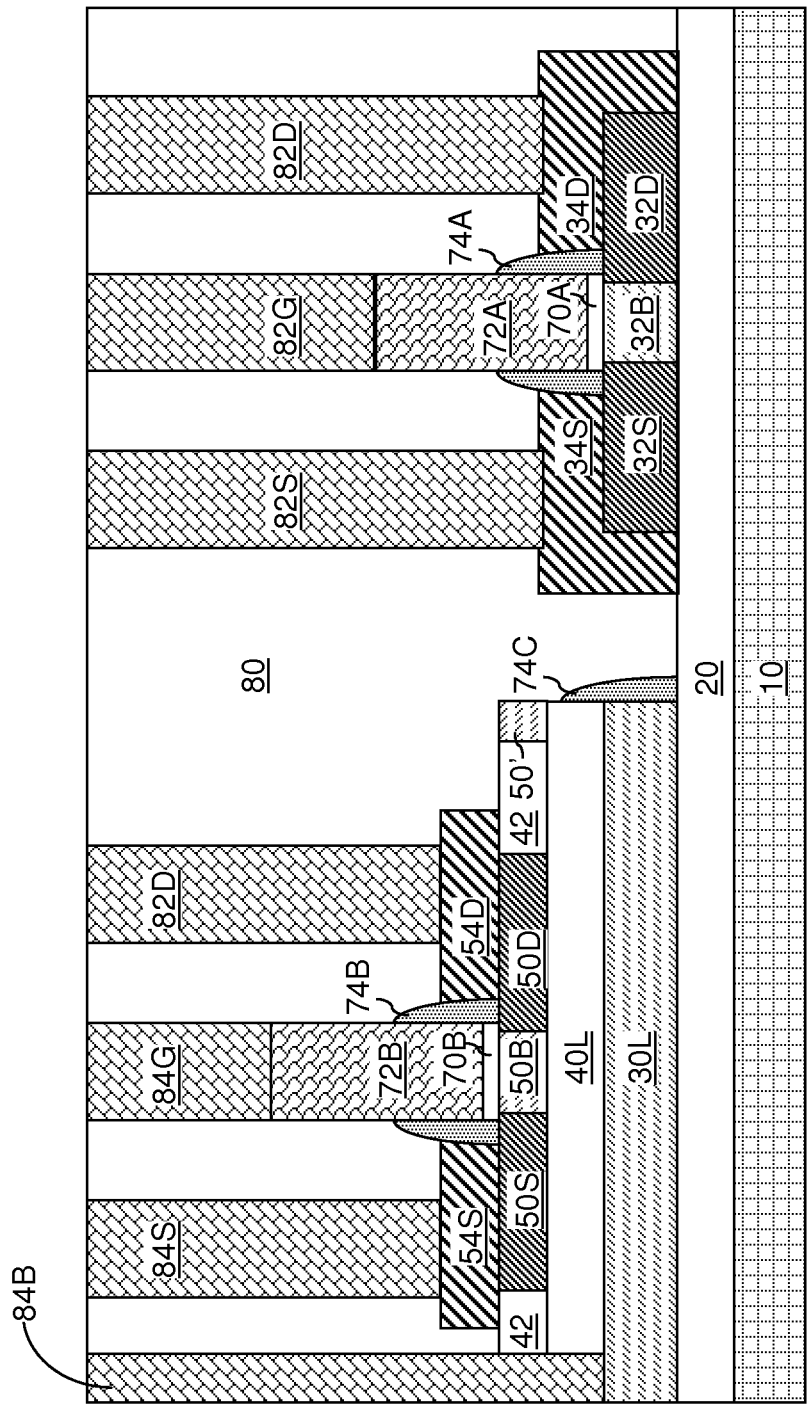
FIG. 13B is a vertical cross-sectional view of the first exemplary semiconductor structure along the vertical plane B-B' of FIG. 13A.

Referring to FIGS. 13A and 13B, various metal semiconductor alloy portions (not shown) may be optionally formed on the surfaces of one or more of the raised fin source region 34S, the raised fin drain region 34D, the raised source region 54S, the raised drain region 54D, the first gate electrode 72A (if a semiconductor material is present therein), and the second gate electrode 72B (if a semiconductor material is present therein). A contact level dielectric layer 80 is deposited over the fin field effect transistor and the planar field effect transistor. Various contact via structures are formed through the contact level dielectric layer 80 to provide electrical contact (and optionally physical contact) to the raised fin source region 34S, the raised fin drain region 34D, the raised source region 54S, the raised drain region 54D, the first gate electrode 72A, the second gate electrode 72B, and the buried semiconductor layer 30L, which can be a back gate electrode of the planar field effect transistor. The various contact via structures can include, for example, a fin source contact via structure 82S that provides electrical contact to the raised fin source region 34S, a fin drain contact via structure 82D that provides electrical contact to the raised fin drain region 34D, a planar source contact via structure 84S that provides electrical contact to the raised source region 54S, a planar drain contact via structure 84D that provides electrical contact to the raised drain region 54D, a fin gate contact via structure 82G that provides electrical contact to the first gate electrode 72A, a planar gate contact via structure 84G that provides electrical contact to the second gate electrode 72B, and a back gate contact via structure 84G that passes through one of the at least one shallow trench isolation structure 42 and contacting the buried semiconductor layer 30L.

The fin field effect transistor is located on a first portion a lower insulator layer that is the lower buried insulator layer 20 and includes at least one semiconductor fin (32S, 32D, 32B) and a first gate stack (70A, 72A). Each of the at least one semiconductor fin (32S, 32D, 32B) includes a fin source region 32A, a fin drain region 32D, and a fin body region 32B. The first gate stack (70A, 70B) includes a first gate dielectric 70A and a first gate electrode 72A and straddles each of the at least one semiconductor fin (32S, 32D, 32B). The planar field effect transistor is located on a stack, from bottom to top, of a second portion of the lower insulator layer that is the lower buried insulator layer 20, a buried semiconductor layer 30L, and an upper insulator layer that is the upper buried insulator layer 40L, and includes a top semiconductor portion (50S, 50D, 50B) and a second gate stack (70B, 72B). The top semiconductor portion (50S, 50D, 50B) includes a planar source region 50S, a planar drain region 50D, and a planar body region 50B. The second gate stack (70B, 72B) includes a second gate dielectric 70B and a second gate electrode 72B. The height of the first gate electrode 72A above the planar portion of the first gate dielectric 70A is substantially the same as the height of the second gate electrode 72B. Thus, the first vertical distance from the interface between the first gate electrode 72A and the topmost surface of the first gate dielectric to the topmost surface of the first gate electrode 72A is substantially the same as a second vertical distance from the interface between the second gate electrode 72B and the second gate dielectric 70B to the topmost surface of the second gate electrode 72B.

Figure 14:
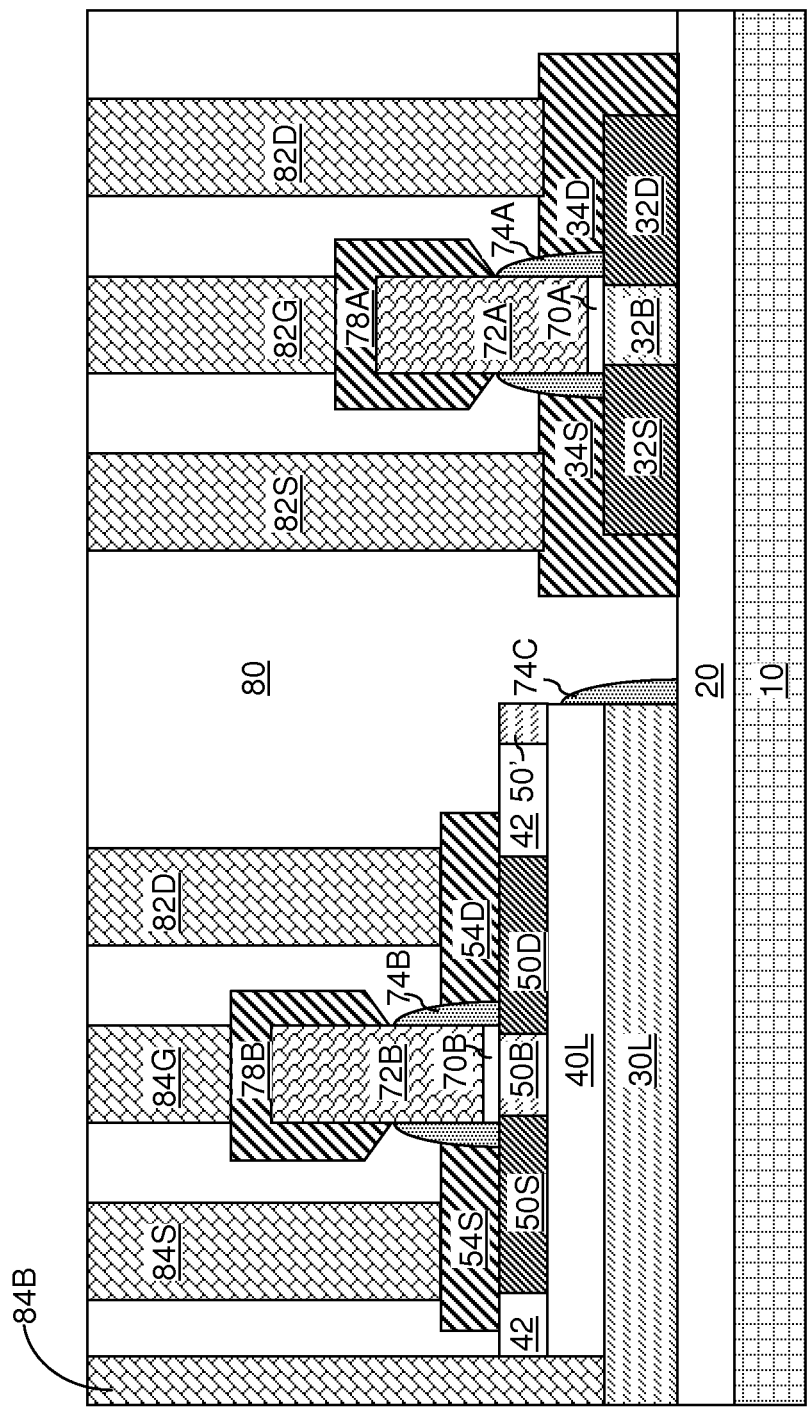
FIG. 14 is a vertical cross-sectional view of a variation of the first exemplary semiconductor structure according to an embodiment of the present disclosure.

Referring to FIG. 14, a variation of the first exemplary semiconductor structure can be derived from the first exemplary semiconductor structure by formation of gate semiconductor portions. Specifically, if semiconductor surfaces are physically exposed at the time of formation of the raised fin source region 34S, the raised fin drain region 34D, the raised source region 54S, and the raised drain region 54D, a first gate semiconductor portion 78A and/or a second gate semiconductor portion 78B can be formed concurrent with the formation of the raised fin source region 34S and the raised fin drain region 34D and/or concurrently with the formation of the raised source region 54S and the raised drain region 54D. Subsequently, the processing steps of FIGS. 13A and 13B can be performed.

Referring to FIGS. 15A and 15B, a second exemplary semiconductor structure is derived from the first exemplary semiconductor structure of FIGS. 9A and 9B by forming disposable gate structures (170A, 170B, 172A, 172B) instead of gate stacks (70A, 70B, 72A, 72B). The disposable gate structures can include a first disposable etch stop material portion 170A, a second disposable etch stop material portion 170B, a first disposable material portion 172A, and a second disposable material portion 172B.

The first and second disposable material portions (172A, 172B) include a material that can be removed selective to a planarization dielectric layer to be subsequently formed. In one embodiment, the first and second disposable material portions (172A, 172B) can include a disposable material such as germanium, a silicon-germanium alloy having a germanium atomic concentration greater than 50%, or organosilicate glass. The first and second disposable etch stop material portions (170A, 170B) includes a material different from the semiconductor materials of the at least one semiconductor fin (32S, 32D, 32B) and the top semiconductor portion (50S, 50D, 50B). For example, the first and second disposable etch stop material portions (170A, 170B) can include silicon oxide, silicon nitride, silicon oxynitride, or combinations thereof.

The disposable gate structures (170A, 170B, 172A, 172B) can be formed, for example, by forming and patterning a stack of a disposable etch stop material layer and a disposable material layer instead of a stack of a gate dielectric layer and a gate electrode layer of the first embodiment. The processing steps of FIGS. 11A and 11B are performed subsequently.

Referring to FIGS. 16A and 16B, a planarization dielectric layer 90 is deposited over the first and second device regions. The planarization dielectric layer 90 includes a dielectric material such as silicon oxide, silicon nitride, silicon oxynitride, and/or organosilicate glass. The planarization dielectric layer 90 is subsequently planarized, for example, by chemical mechanical planarization (CMP), to expose a top surface of the first disposable material portion 172A and a top surface of the second disposable material portion 172B. An upper portion of the second disposable material portion 172B is removed during the planarization. After the planarization, the topmost surface of the first disposable material portion 172A and the topmost surface of the second disposable material portion 172B can be coplanar with the top surface of the planarization dielectric layer 90.

Referring to FIGS. 17A and 17B, the disposable gate structures (170A, 170B, 172A, 172B) are removed to form a first gate cavity in the first device region and to form a second gate cavity in the second device region. A first gate stack (80A, 86A) and a second gate stack (80B, 86B) are simultaneously formed within the first gate cavity and the second gate cavity, respectively. The first gate stack (80A, 86A) is formed over the at least one semiconductor fin (32S, 32D, 32B), and the second gate stack (80B, 86B) is formed over the top semiconductor portion (50S, 50D, 50B).

The first gate stack (80A, 86A) and the second gate stack (80B, 86B) can be formed, for example, by depositing a stack of a gate dielectric layer and a gate electrode layer within the first and second gate cavities and over the planarization dielectric layer 90, and subsequently removing the portions of the gate dielectric layer and the gate electrode layer from above the top surface of the planarization dielectric layer 90. The remaining portions of the gate dielectric layer constitute a first gate dielectric 80A and a second gate dielectric 80B. The remaining portions of the gate electrode layer constitute a first gate electrode 86A and a second gate electrode 86B.

The first and second gate dielectrics (80A, 80B) have the same composition and the same thickness. The first and second gate dielectrics (80A, 80B) can include a dielectric metal oxide and/or a dielectric metal oxynitride and/or silicon oxide and/or silicon oxynitride. Each of the first gate dielectric 80A and the second gate dielectric 80B can be a U-shaped gate dielectric having a topmost surface that is coplanar with the planar top surface of the planarization dielectric layer 90. The first and second gate electrodes (86A, 86B) include the same conductive material.

The second exemplary semiconductor structure includes a fin field effect transistor located in the first device region and on a first portion a lower insulator layer that is the buried insulator layer 20. The fin field effect transistor includes at least one semiconductor fin (32S, 32D, 32B) and a first gate stack. Each of the at least one semiconductor fin (32S, 32D, 32B) includes a fin source region 32S, a fin drain region 32D, and a fin body region 32B. The first gate stack (80A, 86A) includes a first gate dielectric 80A and a first gate electrode 86A, and straddles each of the at least one semiconductor fin (32S, 32D, 32B).

The second exemplary semiconductor structure further includes a planar field effect transistor located on a stack, from bottom to top, of a second portion of the lower insulator layer that is the buried insulator layer 20, a buried semiconductor layer 30L, and an upper insulator layer that is the upper buried insulator layer 40L, and includes a top semiconductor portion (50S, 50D, 50B) and a second gate stack (80B, 86B). The top semiconductor portion (50S, 50D, 50B) includes a planar source region 50S, a planar drain region 50D, and a planar body region 50B. The second gate stack (80B, 86B) includes a second gate dielectric 80B and a second gate electrode 86B.

The second exemplary semiconductor structure further includes a planarization dielectric layer 90 having a planar top surface. A top surface of the first gate electrode 86A and a top surface of the second gate electrode 86B are coplanar with the planar top surface of the planarization dielectric layer 90.

Figure 18A:
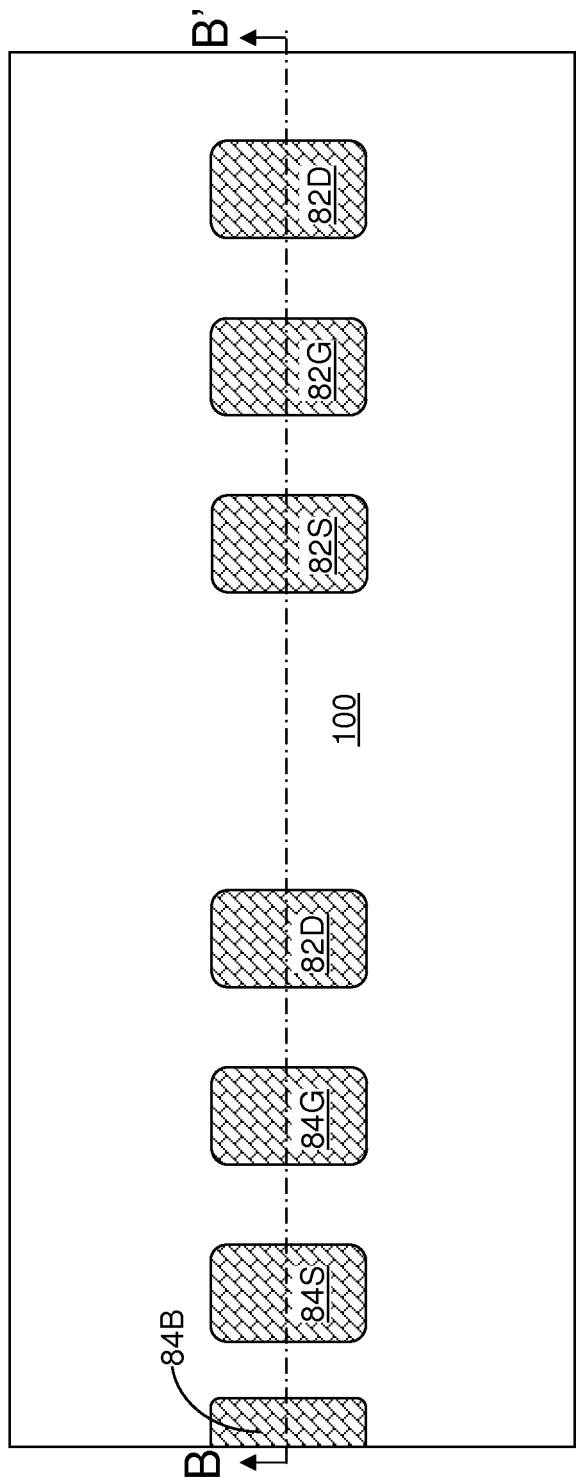
FIG. 18A is a top-down view of the second exemplary semiconductor structure after formation of a contact level dielectric layer and contact via structures according to an embodiment of the present disclosure.
Figure 18B:
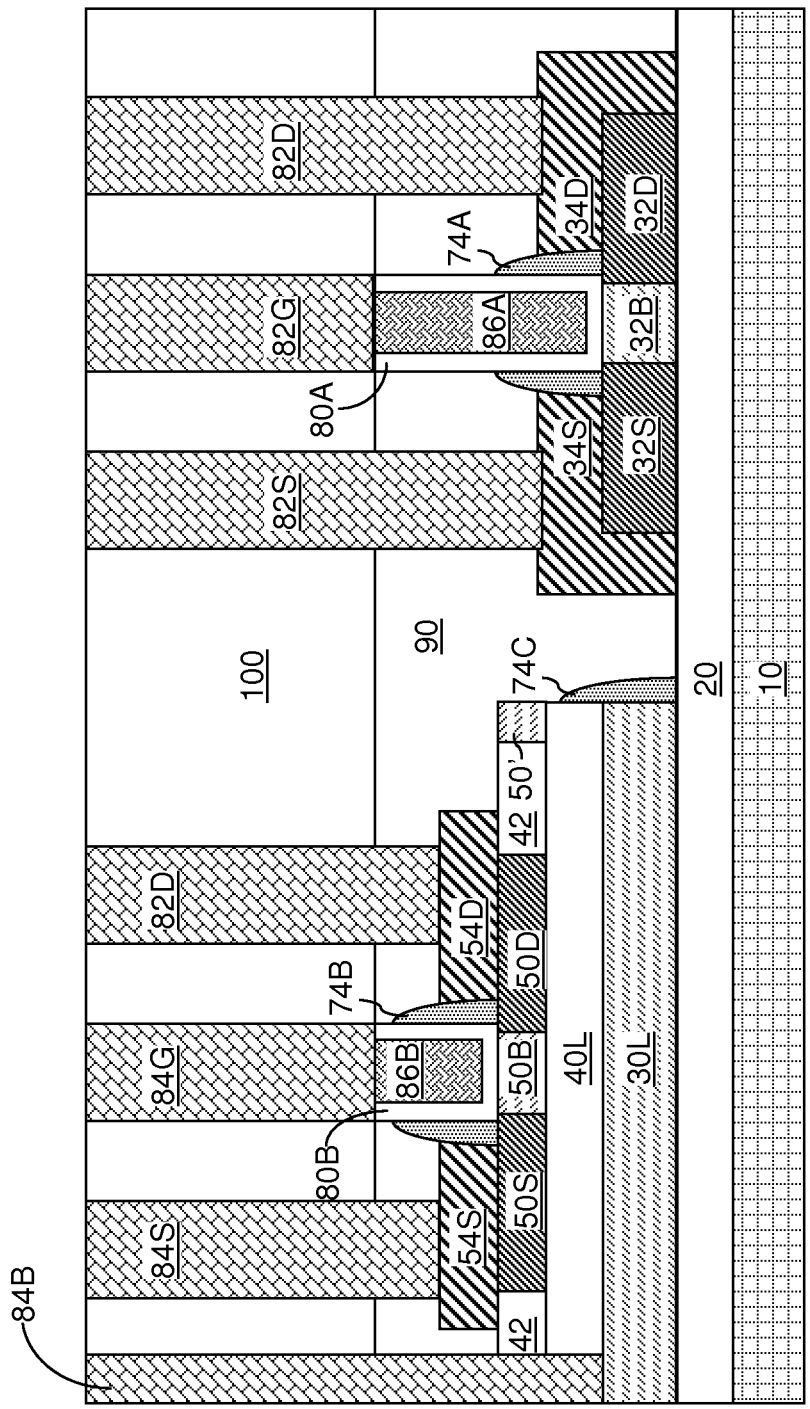
FIG. 18B is a vertical cross-sectional view of the second exemplary semiconductor structure along the vertical plane B-B' of FIG. 18A.

Referring to FIGS. 18A and 18B, various metal semiconductor alloy portions (not shown) may be optionally formed on the surfaces of one or more of the raised fin source region 34S, the raised fin drain region 34D, the raised source region 54S, the raised drain region 54D, the first gate electrode 86A, and the second gate electrode 86B. A contact level dielectric layer 100 is deposited over the planarization dielectric layer 90. Various contact via structures are formed through the contact level dielectric layer 100 and optionally through the planarization dielectric layer 90 to provide electrical contact (and optionally physical contact) to the raised fin source region 34S, the raised fin drain region 34D, the raised source region 54S, the raised drain region 54D, the first gate electrode 86A, the second gate electrode 86B, and the buried semiconductor layer 30L, which can be a back gate electrode of the planar field effect transistor. The various contact via structures can include, for example, a fin source contact via structure 82S that provides electrical contact to the raised fin source region 34S, a fin drain contact via structure 82D that provides electrical contact to the raised fin drain region 34D, a planar source contact via structure 84S that provides electrical contact to the raised source region 54S, a planar drain contact via structure 84D that provides electrical contact to the raised drain region 54D, a fin gate contact via structure 82G that provides electrical contact to the first gate electrode 86A, a planar gate contact via structure 84G that provides electrical contact to the second gate electrode 86B, and a back gate contact via structure 84G that passes through one of the at least one shallow trench isolation structure 42 and contacting the buried semiconductor layer 30L.

Because the at least one semiconductor fin (32S, 32D, 32B) and the top semiconductor portion (50S, 50D, 52B) are formed employing two different semiconductor layers, the material for the body region(s) of the fin field effect transistor and the material of the body region of the planar field effect transistor can be independently selected. Further, the spatial directions of the crystallographic orientations can be independently selected for the body region(s) of the fin field effect transistor and the body region of the planar field effect transistor. Thus, two types of field effect transistors can be independently optimized employing the integration schemes of the various embodiments of the present disclosure.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
 a fin field effect transistor located on a first portion of a lower insulator layer, said fin field effect transistor comprising at least one semiconductor fin and a first gate stack, wherein each of said at least one semiconductor fin has a first width and comprises a fin source region, a fin drain region, and a fin body region laterally surrounded by said fin source region and said fin drain region, and said first gate stack comprises a first gate dielectric and a first gate electrode and straddles each of said at least one semiconductor fin;

a planar field effect transistor located on a stack, from bottom to top, of a second portion of said lower insulator layer, a buried semiconductor layer, and an upper insulator layer, said planar field effect transistor comprising a top semiconductor portion and a second gate stack, wherein said top semiconductor portion has a second width greater than said first width and comprises a planar source region, a planar drain region, and a planar body region laterally surrounded by said planar source region and said planar drain region, and said second gate stack comprises a second gate dielectric and a second gate electrode and straddles said top semiconductor portion; and a planarization dielectric layer having a planar top surface located over said fin field effect transistor, said planar field effect transistor and exposed surfaces of said lower insulator layer and a bottom surface contacting said lower insulator layer, wherein a first vertical distance from an interface between said first gate electrode and a topmost surface of said first gate dielectric to a topmost surface of said first gate electrode is substantially the same as a second vertical distance from an interface between said second gate electrode and said second gate dielectric to a topmost surface of said second gate electrode.

2. The semiconductor structure of claim 1, wherein said first and second gate dielectrics have a same composition and a same thickness, and said first and second gate electrodes comprise a same conductive material.

3. The semiconductor structure of claim 1, wherein each of said at least one semiconductor fin has a vertical dimension between a bottommost surface and a topmost surface that is substantially the same as a thickness of said buried semiconductor layer.

4. The semiconductor structure of claim 1, wherein said buried semiconductor layer and each of said at least one semiconductor fin have a same crystal structure and a same set of spatial directions for each of three independent crystallographic orientations.

5. The semiconductor structure of claim 1, wherein said top semiconductor portion comprises a different semiconductor material than said buried semiconductor layer.

6. The semiconductor structure of claim 1, wherein a first set of spatial directions for three independent crystallographic orientations of a single crystalline structure of said at least one semiconductor fin is rotated relative to a second set of spatial directions for three independent crystallographic orientations of a single crystalline structure of said top semiconductor portion.

7. The semiconductor structure of claim 1, further comprising:

a first gate spacer laterally contacting sidewalls of a lower portion of said first gate electrode; and a second gate spacer laterally contacting sidewalls of a lower portion of said second gate electrode, wherein said first gate electrode comprises a first gate semiconductor portion overlying said first gate spacer, and said second gate electrode comprises a second gate semiconductor portion overlying said second gate spacer, wherein said first and second gate semiconductor portions comprise a same semiconductor material.

8. The semiconductor structure of claim 7, wherein said fin field effect transistor further comprises a raised fin source region epitaxially aligned to each fin source region in said at least one semiconductor fin and a raised fin drain region epitaxially aligned to each fin drain region in said at least one semiconductor fin, and said planar field effect transistor further comprises a raised source region in contact with said planar source region and a raised drain region in contact with said planar drain region, and said raised fin source region, said raised fin drain region, said raised source region, and said raised drain region comprise said same semiconductor material.

9. The semiconductor structure of claim 1, further comprising:

a first gate spacer laterally surrounding said first gate stack;

a second gate spacer laterally surrounding said second gate stack; and a dielectric spacer contacting substantially vertical sidewalls of said buried semiconductor layer and said upper insulator layer and contacting a top surface of said lower insulator layer, wherein said first gate spacer, said second gate spacer, and said dielectric spacer comprise a same dielectric material and have a same lateral width at each bottom portion thereof.

10. The semiconductor structure of claim 8, further comprising shallow trench isolation structures laterally surrounding said top semiconductor portion, each of said shallow trench isolation structures having a bottom surface contacting said upper insulator layer, wherein said planarization dielectric layer is located over said shallow trench isolation structures.

11. The semiconductor structure of claim 10, wherein said fin field effect transistor further comprises a fin source contact via structure extending through said planarization dielectric layer and contacting said raised fin source region, a fin drain contact via structure extending through said planarization dielectric layer and contacting said raised fin drain region, and a fin gate contact via structure extending through said planarization dielectric layer and contacting first gate electrode.

12. The semiconductor structure of claim 11, wherein said planar field effect transistor further comprises a planar source contact via structure extending through said planarization dielectric layer and contacting said raised source region, a planar drain contact via structure extending through said planarization dielectric layer and contacting said raised drain region, a planar gate contact via structure extending through said planarization dielectric layer and contacting said second gate electrode, and a back gate contact via structure extending through said planarization dielectric layer and one of said shallow trench isolation structures and contacting said buried semiconductor layer.

13. The semiconductor structure of claim 1, wherein said lower insulator layer is located over a handle substrate.

14. The semiconductor structure of claim 1, wherein said fin source region and said fin drain region are of a first conductivity, and said planar source region and said planar drain region are of a second conductivity opposite said first conductivity.

15. A semiconductor structure comprising:

a fin field effect transistor located on a first portion of a lower insulator layer, said fin field effect transistor comprising at least one semiconductor fin, a first gate stack, at least one raised fin source region, and at least one raised fin drain region, wherein each of said at least one semiconductor fin has a first width and comprises a fin source region, a fin drain region, and a fin body region laterally surrounded by said fin source region and said fin drain region, said first gate stack comprises a first gate dielectric and a first gate electrode and straddles each of said at least one semiconductor fin, each of said at least one raised fin source region is epitaxially aligned to said fin source region in each of said at least one semiconductor fin, and each of said at least one raised fin drain region is epitaxially aligned to said fin drain region in each of said at least one semiconductor fin;

a planar field effect transistor located on a stack, from bottom to top, of a second portion of said lower insulator layer, a buried semiconductor layer, and an upper insulator layer, said planar field effect transistor comprising a top semiconductor portion, a second gate stack, a raised source region, and a raised drain region, wherein said top semiconductor portion has a second width greater than said first width and comprises a planar source region, a planar drain region, and a planar body region laterally surrounded by said planar source region and said planar drain region, said second gate stack comprises a second gate dielectric and a second gate electrode and straddles said top semiconductor portion, said raised source region vertically contacts said planar source region, and said raised drain region vertically contacts said planar drain region;

a planarization dielectric layer having a planar top surface located over said fin field effect transistor, said planar field effect transistor and exposed surfaces of said lower insulator layer, wherein a first vertical distance from an interface between said first gate electrode and a topmost surface of said first gate dielectric to a topmost surface of said first gate electrode is substantially the same as a second vertical distance from an interface between said second gate electrode and said second gate dielectric to a topmost surface of said second gate electrode;

shallow trench isolation structures laterally surrounding said top semiconductor portion and vertically contacting said upper insulator layer, wherein said planarization dielectric layer is located over said shallow trench isolation structures;

a fin source contact via structure extending through said planarization dielectric layer and contacting said at least one raised fin source region, a fin drain contact via structure extending through said planarization dielectric layer and contacting said at least one raised fin drain region, and a fin gate contact via structure extending through said planarization dielectric layer and contacting first gate electrode; and a planar source contact via structure extending through said planarization dielectric layer and contacting said raised source region, a planar drain contact via structure extending through said planarization dielectric layer and contacting said raised drain region, a planar gate contact via structure extending through said planarization dielectric layer and contacting said second gate electrode, and a back gate contact via structure extending through said planarization dielectric layer and one of said shallow trench isolation structures and contacting said buried semiconductor layer.

* * * * *